US009941472B2

(12) United States Patent
Elmegreen et al.

(10) Patent No.: US 9,941,472 B2
(45) Date of Patent: Apr. 10, 2018

(54) PIEZOELECTRONIC DEVICE WITH NOVEL FORCE AMPLIFICATION

(71) Applicant: International Business Machines Corporation, Armonk, NY (US)

(72) Inventors: Bruce G. Elmegreen, Goldens Bridge, NY (US); Marcelo A. Kuroda, Auburn, AL (US); Xiao Hu Liu, Briarcliff Manor, NY (US); Glenn J. Martyna, Croton on Hudson, NY (US); Dennis M. Newns, Yorktown Heights, NY (US); Paul M. Solomon, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 579 days.

(21) Appl. No.: 14/577,279

(22) Filed: Dec. 19, 2014

(65) Prior Publication Data

US 2015/0255699 A1 Sep. 10, 2015

Related U.S. Application Data

(60) Provisional application No. 61/950,343, filed on Mar. 10, 2014.

(51) Int. Cl.
*H01L 41/09* (2006.01)
*H01L 49/00* (2006.01)

(52) U.S. Cl.
CPC .......... *H01L 49/00* (2013.01); *H01L 41/0986* (2013.01)

(58) Field of Classification Search
CPC ..................................................... H02N 2/043
See application file for complete search history.

(56) References Cited

U.S. PATENT DOCUMENTS

| 5,872,372 | A  | 2/1999  | Lee et al.       |
|-----------|----|---------|------------------|
| 5,883,419 | A  | 3/1999  | Lee et al.       |
| 7,848,135 | B2 | 12/2010 | Elmegreen et al. |
| 7,968,945 | B2 | 6/2011  | Lolivier et al.  |
| 7,973,350 | B2 | 7/2011  | Collonge et al.  |
| 8,159,854 | B2 | 4/2012  | Elmegreen et al. |

(Continued)

OTHER PUBLICATIONS

List of IBM Patents or Patent Applications Treated as Related; (Appendix P), Filed Nov. 17, 2016; 2 pages.

(Continued)

*Primary Examiner* — J. San Martin
(74) *Attorney, Agent, or Firm* — Cantor Colburn LLP; Vazken Alexanian

(57) ABSTRACT

A piezoelectronic device with novel force amplification includes a first electrode; a piezoelectric layer disposed on the first electrode; a second electrode disposed on the piezoelectric layer; an insulator disposed on the second electrode; a piezoresistive layer disposed on the insulator; a third electrode disposed on the insulator; a fourth electrode disposed on the insulator; a semi-rigid housing surrounding the layers and the electrodes; wherein the semi-rigid housing is in contact with the first, third, and fourth electrodes and the piezoresistive layer; wherein the semi-rigid housing includes a void. The third and fourth electrodes are on the same plane and separated from each other in the transverse direction by a distance.

27 Claims, 28 Drawing Sheets

(56) References Cited

U.S. PATENT DOCUMENTS

| | | | |
|---|---|---|---|
| 8,247,947 B2 | 8/2012 | Elmegreen et al. | |
| 8,405,279 B2 | 3/2013 | Elmegreen et al. | |
| 9,263,664 B1* | 2/2016 | Bryce | H01L 41/02 |
| 9,419,201 B2 | 8/2016 | Bryce et al. | |
| 9,419,203 B2 | 8/2016 | Bryce et al. | |
| 9,444,029 B2 | 9/2016 | Bryce et al. | |
| 2008/0230826 A1* | 9/2008 | Das | H01L 21/28273 257/316 |
| 2011/0049579 A1* | 3/2011 | Dumitru | B82Y 10/00 257/254 |
| 2013/0009668 A1 | 1/2013 | Elmegreen et al. | |
| 2014/0169078 A1 | 6/2014 | Elmegreen et al. | |
| 2016/0111154 A1 | 4/2016 | Elmegreen et al. | |

OTHER PUBLICATIONS

Matthew W. Copel et al., "Piezoelectronic Switch Device for RF Applications", U.S. Appl. No. 14/745,521, filed Jun. 22, 2015.
List of IBM Patents or Patent Applications Treated as Related; (Appendix P), Filed May 25, 2016; 2 pages.
Matthew W. Copel et al., "Piezoelectronic Switch Device for RF Applications", U.S. Appl. No. 15/163,821, filed May 25, 2016.
List of IBM Patents or Patent Applications Treated as Related; (Appendix P), Filed Apr. 20, 2016; 2 pages.
Bruce G. Elmegreen et al., "Low Voltage Transistor and Logic Devices With Multiple, Stacked Piezoelectronic Layers", U.S. Appl. No. 15/131,484, filed Apr. 18, 2016.
List of IBM Patents or Patent Applications Treated as Related; (Appendix P), Filed Sep. 1, 2016; 2 pages.
Bruce G. Elmegreen et al., "Low Voltage Transistor and Logic Devices With Multiple, Stacked Piezoelectronic Layers", U.S. Appl. No. 15/248,488, filed Aug. 26, 2016.
A. Jayaraman, et al., "Study of the Valence Transition in Eu-, Yb-, and Ca—substituted SmS under High Pressure and some Comments on other Substitutions," Physical Review B, vol. 19, No. 8, Apr. 15, 1979, pp. 1-8.
Brian A. Bryce, et al., "Integrating a Piezoresistive Element in a Piezoelectronic Transistor" U.S. Appl. No. 14/529,886, filed Oct. 31, 2014.
Brian A. Bryce, et al., "Passivation and Alignment of Piezoelectronic Transistor Piezoresistor" U.S. Appl. No. 14/529,929, filed Oct. 31, 2014.
Brian A. Bryce, et al., "Piezoelectronic Transistor With Co-Planar Common and Gate Electrodes" U.S. Appl. No. 14/529,834, filed Oct. 31, 2014.
Bruce G. Elmegreen, et al., "Low Voltage Transistor and Logic Devices With Multiple, Stacked Piezoelectronic Layers" U.S. Appl. No. 14/468,822, filed Aug. 26, 2014.
Bruce G. Elmegreen, et al., "Non-Volatile, Piezoelectronic Memory Based on Piezoresistive Strain Produced by Piezoelectronic Remanence," U.S. Appl. No. 14/222,813, filed Mar. 24, 2014.
D. Newns, et al., "A Low-Voltage High-Speed Electronic Switch Based on Piezoelectric Transduction," Journal of Applied Physics, 111, 084509, 2012, pp. 1-18.
D. Xue, et al., "Elastic, piezoelectric, and dielectric properties of $Ba(Zr0.2Ti0.8)O3-50(Ba0.7Ca0.3)TiO3$ Pb—free ceramic at the morphotropic phase boundary," Journal of Applied Physics, 109, 054110, 2011, pp. 1-7.
D.M. Newns, B.G. Elmegreen, X.-H. Liu, G. Martyna, "High Response Piezoelectric and Piezoresistive Materials for Fast, Low Voltage Switching : Simulation and Theory of Novel Transduction Physics at the Nanoscale" Advanced Materials, 2012, pp. 1-7.
Hu Cao, et al., "Elastic, Piezoelectric, and Dielectric Properties of $0.58Pb(Mg1/3Nb2/3)$ $O3-0.42PbTiO3$ Singel Crystal," Journal of Applied Physics, vol. 96, No. 1, Jul. 1, 2004, pp. 1-6.
J. Park, et al., "Direct Observation of Nanoparticle Superlattice Formation by Using Liquid Cell Transmission Electron Microscopy," ACS Nano, vol. 6, No. 3, Feb. 2012, pp. 2078-2085.
List of IBM Patents or Patent Applications Treated as Related; YOR920130299US2, Dec. 19, 2014, pp. 1-2.
Matthew W. Copel, et al., "Piezoelectronic Switch Device for RF Applications" U.S. Appl. No. 14/529,380, filed Oct. 31, 2014.

\* cited by examiner

PIEZOELECTRONIC DEVICE WITH NOVEL FORCE AMPLIFICATION

DOMESTIC PRIORITY

This application claims priority to U.S. Provisional Application No. 61/950,343, entitled "PIEZOELECTRONIC DEVICE WITH NOVEL FORCE AMPLIFICATION," filed Mar. 10, 2014, which is incorporated herein by reference in its entirety.

FEDERALLY SPONSORED RESEARCH AND DEVELOPMENT

This invention was made with Government support under Contract No.: N66001-11-C-4109 awarded by Defense Advanced Research Projects Agency (DARPA). The Government has certain rights in this invention.

BACKGROUND

The present invention relates to piezotronics, and more specifically, to piezoelectronic devices with force amplification designs.

Piezotronics is a new field of computer technology based on the piezoelectronic transistor (PET) and variants. In PET operation, a piezoelectric (PE) layer, that expands or contracts with an applied voltage, is used to compress a piezoresistive (PR) layer that changes its resistivity upon pressurization. When the PR layer is non-hysteretic, compression and decompression act as a switch that opens and closes a conductive channel. Three and four terminal switches have been described in the prior art (U.S. Pat. No. 7,848,135; U.S. Pat. No. 8,159,854; U.S. Pat. No. 8,247,947; and U.S. Patent Publication No. 2013/0009668 A1), along with new designs for logic that use these switches.

When the PR layer is hysteretic, a period of high compression followed by a partial release can set the resistance to a low and stable value, and a period of low compression and release can set the resistance to a high and stable value. Such a device makes a piezoelectronic memory (PEM) cell. PEM using hysteric phase change material has been proposed in the prior art (ELMEGREEN et al., U.S. patent application Ser. No. 13/719,965).

A four-terminal PET from the prior art is shown in FIG. 1 for reference. The viewpoint is from the side and fabrication is in layers from the bottom to the top. Two gate electrodes actuate the PE layer, which expands and contracts vertically (the z direction) according to the voltage drop across them. Two sense electrodes straddle the PR layer and sense the resistance across it. These two pairs of electrodes are separated from each other by an insulator. The current through the PR layer is along the axis of the device, the same direction as the applied field on the PE layer.

A thinner PR layer is advantageous because its internal pressure can be increased to the required switching pressure with a smaller expansion of the PE layer. However a potential disadvantage of the design in the prior art is that the thickness of the PR layer is limited to a few nanometers by quantum tunneling. Smaller dimensions are likely to have undesirable leakage currents from quantum tunneling through the PR layer. Quantum tunneling is also a problem for conventional CMOS FETs.

The present invention proposes solutions to the limitations that are inherent in the prior art.

SUMMARY

According to one embodiment of the present invention, a piezoelectric device is provided. The device includes: a first electrode; a piezoelectric layer disposed on the first electrode; a second electrode disposed on the piezoelectric layer; an insulator disposed on the second electrode; a piezoresistive layer, having a top, a bottom, a left, and right side, disposed on the insulator; a third electrode, having a first portion and a second portion, disposed on the insulator; a fourth electrode, having a first portion and a second portion, disposed on the insulator; a semi-rigid housing, having a top, a bottom, and two sides; where the semi-rigid housing surrounds the piezoelectric layer, the piezoresistive layer, the insulator layer, and the electrodes; where the bottom of the semi-rigid housing is in contact with the first electrode and the top of the semi-rigid housing is in contact with the third and fourth electrodes and the piezoresistive layer; where between the two sides of the semi-rigid housing and the layers and the electrodes is a void; where the first and second portion of the third electrode, the first and second portion of the fourth electrode, and the piezoresistive layer each have a yield strength; and where an applied voltage across the first and second electrodes causes a pressure from the piezoelectric layer to be applied to the piezoresistive layer through the insulator layer, such that an electrical resistance of the piezoresistive layer is dependent upon the pressure applied by the piezoelectric layer.

According to a second embodiment of the present invention, a piezoelectric device is provided. The device includes: a first spacing layer; a second spacing layer; a first electrode disposed on the first spacing layer; a second electrode disposed on the second spacing layer; a piezoelectric layer, grown with 100 orientation, partially disposed on the first spacing layer and partially disposed on the second spacing layer, wherein the piezoelectric layer is disposed between the first electrode and the second electrode; an insulator layer disposed on the piezoelectric layer; a third electrode disposed on the insulator layer; a piezoresistive layer disposed on the third electrode; a fourth electrode disposed on the piezoresistive layer; a semi-rigid housing, having a top, a bottom, and two sides; where the semi-rigid housing surrounds the piezoelectric layer, the piezoresistive layer, the insulator layer, the spacing layers, and the electrodes; where the bottom of the semi-rigid housing is in contact with the first and second spacing layer, partial contact with the piezoelectric layer; where the top of the semi-rigid housing is in contact with the fourth electrode; where between the two sides of the semi-rigid housing and the layers and the electrodes is a void; and where an applied voltage across the first and second electrodes causes an expansion of the piezoelectric layer in the transverse direction whereby a pressure from the piezoelectric layer is applied to the piezoresistive layer through the insulator layer, such that an electrical resistance of the piezoresistive layer is dependent upon the pressure applied by the piezoelectric layer.

According to a third embodiment of the present invention, a piezoelectric device is provided. The device includes: a first spacing layer; a second spacing layer; a first electrode disposed on the first spacing layer; a second electrode disposed on the second spacing layer; a piezoelectric layer, grown with 100 orientation, partially disposed on the first spacing layer and partially disposed on the second spacing layer, wherein the piezoelectric layer is disposed between the first electrode and the second electrode; an insulator layer disposed on the piezoelectric layer; a third electrode, having a first portion and a second portion, disposed on the insulator layer; a piezoresistive layer, having a top, a bottom, a left, and a right side, disposed on the insulator layer; a fourth electrode, having a first portion and a second portion, disposed on the insulator layer; a semi-rigid housing, having a top, a bottom and two sides; where the semi-rigid housing surrounds the piezoelectric layer, the piezoresistive layer, the insulator layer, the spacing layers, and the electrodes; where the bottom of the semi-rigid housing is in contact with the first and second spacing layers, partial contact with the piezoelectric layer; where the top of the semi-rigid housing is in contact with the third and fourth electrodes and the piezoresistive layer; where between the two sides of the semi-rigid housing and the layers and the electrodes is a void; where the first and second portion of the third electrode, the first and second portion of the fourth electrode, and the piezoresistive layer each have a yield strength; and where an applied voltage across the first and second electrodes causes an expansion of the piezoelectric layer in the transverse direction whereby a pressure from the piezoelectric layer is applied to the piezoresistive layer through the insulator layer, such that an electrical resistance of the piezoresistive layer is dependent upon the pressure applied by the piezoelectric layer.

According to a fourth embodiment of the present invention, a piezoelectric device is provided. The device includes: a first electrode; a piezoelectric layer disposed on the first electrode; a second electrode disposed on the piezoelectric layer; a piezoresistive layer disposed on the second electrode, where the second electrode and the piezoresistive layer have a contact region covering an area; conducting nanoparticles disposed on the piezoresistive layer; where the conducting nanoparticles and the piezoresistive layer have a contact region covering an area; a third electrode disposed on the conducting nanoparticles; a semi-rigid housing, having a top, a bottom, and two sides; where the semi-rigid housing surrounds the piezoelectric layer, the piezoresistive layer, the conducting nanoparticles, and the electrodes; where the bottom of the semi-rigid housing is in contact with the first electrode and the top of the semi-rigid housing is in contact with the third electrode; where between the two sides of the semi-rigid housing and the layers and the electrodes is a void; and where an applied voltage across the first and second electrode causes a pressure from the piezoelectric layer to be applied to the piezoresistive layer, such that an electrical resistance of the piezoresistive layer is dependent upon the pressure applied by the piezoelectric layer.

According to a fifth embodiment of the present invention, a piezoelectric device is provided. The device includes: a first electrode; a piezoelectric layer disposed on the first electrode; a second electrode disposed on the piezoelectric layer; conducting nanoparticles disposed on the second electrode; a piezoresistive layer disposed on the conducting nanoparticles, where the conducting nanoparticles and the piezoresistive layer have a contact region covering an area; a third electrode disposed on the piezoresistive layer, where the third electrode and the piezoresistive layer have a contact region covering an area; a semi-rigid housing, having a top, a bottom, and two sides; where the semi-rigid housing surrounds the piezoelectric layer, the piezoresistive layer, the conducting nanoparticles, and the electrodes; where the bottom of the semi-rigid housing is in contact with the first electrode and the top of the semi-rigid housing is in contact with the third electrode; where between the two sides of the semi-rigid housing and the layers and the electrodes is a void; and where an applied voltage across the first and second electrode causes a pressure from the piezoelectric layer to be applied to the piezoresistive layer, such that an electrical resistance of the piezoresistive layer is dependent upon the pressure applied by the piezoelectric layer.

According to a sixth embodiment of the present invention, a piezoelectric device is provided. The device includes: a first electrode; a piezoelectric layer disposed on the first electrode; a second electrode disposed on the piezoelectric layer; a piezoresistive layer disposed on the second electrode, where the second electrode and the piezoresistive layer have a contact region covering an area; a third electrode disposed on the piezoresistive layer, where the third electrode and the piezoresistive layer have a contact region covering an area; a semi-rigid housing, having a top, a bottom, and two sides; where the semi-rigid housing surrounds the piezoelectric layer, the piezoresistive layer, and the electrodes; where the bottom of the semi-rigid housing is in contact with the first electrode and the top of the semi-rigid housing is in contact with the third electrode; where between the two sides of the semi-rigid housing and the layers and the electrodes is a void; wherein the area of the contact region of the second electrode and the piezoresistive layer is either less than or greater than the area of the contact region of the third electrode and the piezoresistive layer; and where an applied voltage across the first and second electrode causes a pressure from the piezoelectric layer to be applied to the piezoresistive layer, such that an electrical resistance of the piezoresistive layer is dependent upon the pressure applied by the piezoelectric layer.

According to a seventh embodiment of the present invention, a piezoelectric device is provided. The device includes: a first electrode; a piezoelectric layer disposed on the first electrode; a second electrode disposed on the piezoelectric layer; an insulator layer disposed on the second electrode; a third electrode disposed on the insulator layer; conducting nanoparticles disposed on the third electrode; a piezoresistive layer disposed on the conducting nanoparticles, where the conducting nanoparticles and the piezoresistive layer have a contact region covering an area; a fourth electrode disposed on the piezoresistive layer, where the fourth electrode and the piezoresistive layer have a contact region covering an area; a semi-rigid housing, having a top, a bottom, and two sides; where the semi-rigid housing surrounds the piezoelectric layer, the piezoresistive layer, the insulator layer, the conducting nanoparticles, and the electrodes; where the bottom of the semi-rigid housing is in contact with the first electrode and the top of the semi-rigid housing is in contact with the fourth electrode; where between the two sides of the semi-rigid housing and the layers and the electrodes is a void; and where an applied voltage across the first and second electrodes causes a pressure from the piezoelectric layer to be applied to the piezoresistive layer through the insulator layer, such that an electrical resistance of the piezoresistive layer is dependent upon the pressure applied by the piezoelectric layer.

According to an eighth embodiment of the present invention, a piezoelectric device is provided. The device includes: a first electrode; a piezoelectric layer disposed on the first electrode; a second electrode disposed on the piezoelectric layer; an insulator layer disposed on the second electrode; a third electrode disposed on the insulator layer; a piezoresistive layer disposed on the third electrode, where the third electrode and the piezoresistive layer have a contact region covering an area; conducting nanoparticles disposed on the piezoresistive layer, where the conducting nanoparticles and the piezoresistive layer have a contact region covering an area; a fourth electrode disposed on the conducting nanoparticles; a semi-rigid housing, having a top, a bottom, and two sides; wherein the semi-rigid housing surrounds the piezoelectric layer, the piezoresistive layer, the insulator layer, the conducting nanoparticles, and the electrodes;

where the bottom of the semi-rigid housing is in contact with the first electrode and the top of the semi-rigid housing is in contact with the fourth electrode; where between the two sides of the semi-rigid housing and the layers and the electrodes is a void; and where an applied voltage across the first and second electrodes causes a pressure from the piezoelectric layer to be applied to the piezoresistive layer through the insulator layer, such that an electrical resistance of the piezoresistive layer is dependent upon the pressure applied by the piezoelectric layer.

According to a ninth embodiment of the present invention, a piezoelectric device is provided. The device includes: a first electrode; a piezoelectric layer disposed on the first electrode; a second electrode disposed on the piezoelectric layer; an insulator layer disposed on the second electrode; a third electrode disposed on the insulator layer; a piezoresistive layer disposed on the third electrode, where the third electrode and the piezoresistive layer have a contact region covering an area; a fourth electrode disposed on the piezoresistive layer, where the fourth electrode and the piezoresistive layer have a contact region covering an area; a semi-rigid housing, having a top, a bottom, and two sides; where the semi-rigid housing surrounds the piezoelectric layer, the piezoresistive layer, insulator layer, and the electrodes; where the bottom of the semi-rigid housing is in contact with the first electrode and the top of the semi-rigid housing is in contact with the fourth electrode; where between each of the two sides of the semi-rigid housing and the layers and the electrodes is a void; where the area of the contact region of the third electrode and the piezoresistive layer is either less than or greater than the area of the contact region of the fourth electrode and the piezoresistive layer; and where an applied voltage across the first and second electrodes causes a pressure from the piezoelectric layer to be applied to the piezoresistive layer through the insulator layer, such that an electrical resistance of the piezoresistive layer is dependent upon the pressure applied by the piezoelectric layer.

DETAILED DESCRIPTION

Embodiments of the present invention will now be described below with reference to the accompanying drawings. In the following description, elements that are identical are referenced by the same reference numbers in all the drawings unless noted otherwise. The configurations explained here are provided as preferred embodiments, and it should be understood that the technical scope of the present invention is not intended to be limited to these embodiments.

Figure 1:
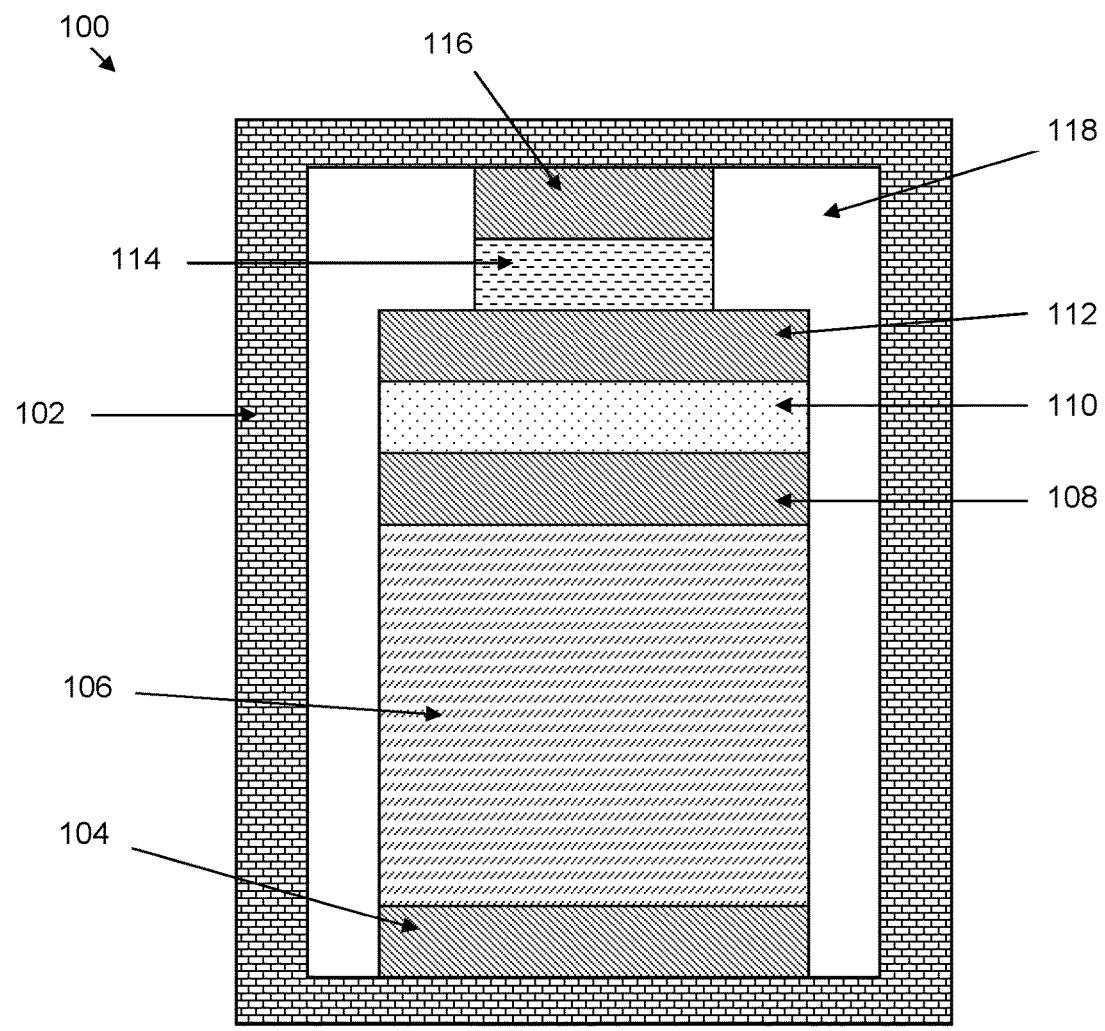
FIG. 1 is a schematic cross-sectional diagram of a four-terminal piezoelectronic transistor (4PET) found in the prior art.

FIG. 1 depicts a schematic cross-sectional diagram of a 4PET 100 found in the prior art. 4PET 100 includes a piezoelectric (PE) layer 106. PE layer 106 is a material that can either expand or contract when an electric potential is applied across it. PE layer 106 is disposed between a first gate electrode 104 and a second gate electrode 108. A low permittivity insulator layer 110 separates second gate electrode 108 from a first sense electrode 112.

Insulator layer 110 separating second gate electrode 108 and first sense electrode 112 can have a relatively high Young's modulus, such as in the range of 60 gigapascals (GPa) to about 250 GPa, for example, a relatively low dielectric constant (e.g., about 4-12 relative to vacuum), and a high breakdown field. Suitable insulator materials thus include, for example, silicon dioxide ($SiO_2$) or silicon nitride ($Si_xN_y$). Further in FIG. 1, a PR layer 114 is disposed between first sense electrode 112 and a second sense electrode 116. 4PET 100 includes a high yield strength material (HYSM) 102, such as silicon dioxide ($SiO_2$) or silicon nitride ($Si_xN_y$) that surrounds and encapsulates all of the components described above. There is a gap or vacant space 118 between the various layers of 4PET 100 and the sides of HYSM 102, which increases the freedom of mechanical displacements of the layers. The vacant space can also be filled with a gas (e.g., air). By enclosing the entire device in a HYSM, the pressure exerted by the PE layer on the PR layer is contained. If the device had no HYSM, the PR layer would move away from the PE layer without significant compression in the PR layer.

The electrodes in 4PET 100 can include materials such as strontium ruthenium oxide ($SrRuO_3$ (SRO)), platinum (Pt), tungsten (W) or other suitable mechanically hard conducting materials. PE layer 106 can include a relaxor piezoelectric such as PMN-PT (lead magnesium niobate-lead titanate) or PZN-PT (lead zinc niobate-lead titanate) or other PE materials typically made from perovskite titanates. Such PE materials have a large value of displacement/V $d_{33}$, e.g., $d_{33}$=2500 pm/V, support a relatively high piezoelectric strain (~1%), and have a relatively high endurance, making them ideal for the PET application. PE layer 106 could also include another material such as PZT (lead zirconate titanate). PR layer 114 is a material which undergoes an insulator-to-metal transition under a relatively low pressure in a range such as 0.4-3.0 GPa. Some examples of PR material include samarium selenide (SmSe), thulium telluride (TmTe), nickel disulfide/diselenide ($Ni(S_xSe_{1-x})_2$), vanadium oxide ($V_2O_3$) doped with a small percentage of Cr, calcium ruthenium oxide ($Ca_2RuO_4$), etc.

In operation of 4PET 100, an input voltage between first gate electrode 104 and second gate electrode 108 can be always positive or zero. When the input voltage is zero, PE layer 106 has no displacement and PR layer 114 is uncompressed, giving it a high electrical resistance such that 4PET 100 is "off". When a significant positive voltage is applied between first gate electrode 104 and second gate electrode 108, PE layer 106 develops a positive strain. That is, PE layer 106 expands upwards along the axis perpendicular to the stack. The upward expansion of PE layer 106 tries to compress insulator layer 110, but the main effect is to compress the more compressible PR layer 114. The compressive action is effective because the surrounding HYSM 102 strongly constrains the relative motion of the top of second sense electrode 116 and the bottom of first gate electrode 104. The combined effect of the mechanical compression of PR layer 114 by the constrained stack and PR layer 114 piezoresistive response is to lower first sense electrode 112 to second sense electrode 116 impedance by about 3-5 orders of magnitude under conditions where the input voltage is the designed line voltage VDD. The PET switch is now "on."

The embodiments of the present invention propose PET designs with PR layer current perpendicular to the PE layer electric field. The embodiments all solve, in different ways, certain limitations that are inherent in the prior art design of FIG. 1.

According to embodiments of the present invention, the PR layer is sensed in a direction perpendicular to its compression, allowing the distance between the sense electrodes to be much larger than the thickness of the PR layer. This helps to minimize quantum tunneling.

Figure 2:
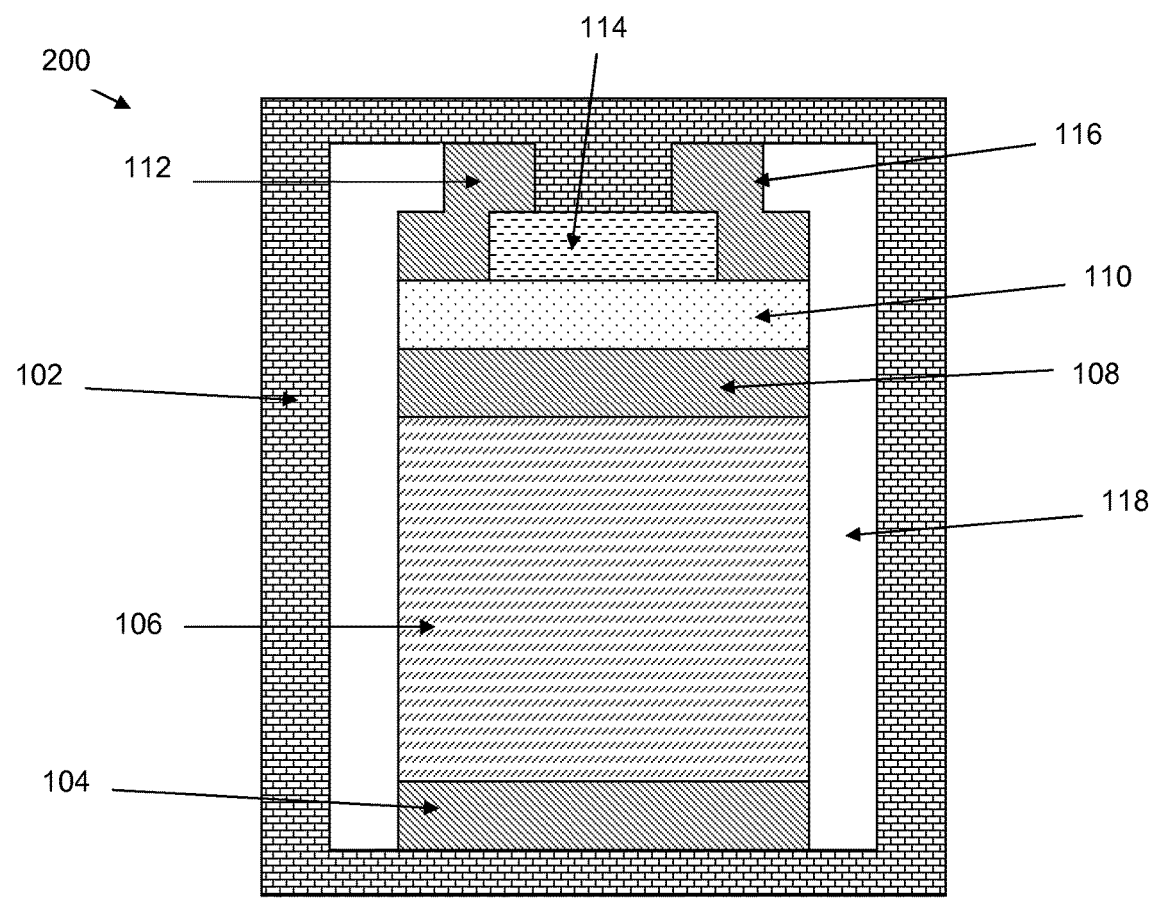
FIG. 2 is a schematic cross-sectional diagram of a 4PET, according to an embodiment of the present invention, showing sense electrodes that wrap a piezoresistive (PR) layer.

According to embodiments of the present invention, FIG. 2 shows a cross-sectional diagram of a 4PET 200 where the PR layer has sense electrodes that control current in the transverse direction. A PE layer 106 is disposed on a first gate electrode 104 and a second gate electrode 108 is disposed on PE layer 106. An insulator layer 110 is then disposed on second gate electrode 108. A first sense electrode 112, a PR layer 114, and a second sense electrode 116 are then disposed on insulator layer 110. A HYSM 102 surrounds and encapsulates all of the components described above. Again, there is a gap or vacant space 118 between the various layers of the PET and the sides of HYSM 102.

Where FIG. 2 modifies the design of FIG. 1 is in the configuration of first and second sense electrodes 112 & 116 in relation to PR layer 114. In FIG. 2, first sense electrode 112 and second sense electrode 116 share the same plane. A portion of first sense electrode 112 wraps the left side of PR layer 114 and the remaining portion of first sense electrode 112 wraps the top side of PR layer 114. A portion of second sense electrode 116 wraps the right side of PR layer 114 and the remaining portion of second sense electrode 116 wraps the top side of PR layer 114. The placement of the sense electrodes in this manner allows for maximum electrical contact between the PR layer and the sense electrodes.

The portions of first and second sense electrodes 112 & 116 that wrap the top of PR layer 114 are separated from each other in the transverse direction by a distance. The top of HYSM 102 separates the sense electrodes and contacts the top of PR layer at this distance between them. The distance should be large enough that quantum tunneling is minimized (e.g., 4 nm).

Between the top of HYSM 102 and the portions of the first and second sense electrodes 112 & 116 that wrap the left and right side of PR layer 114 there is a gap or void space. As a result, the sense electrodes' resistance to the expansion of the PE layer is minimal.

Figure 3:
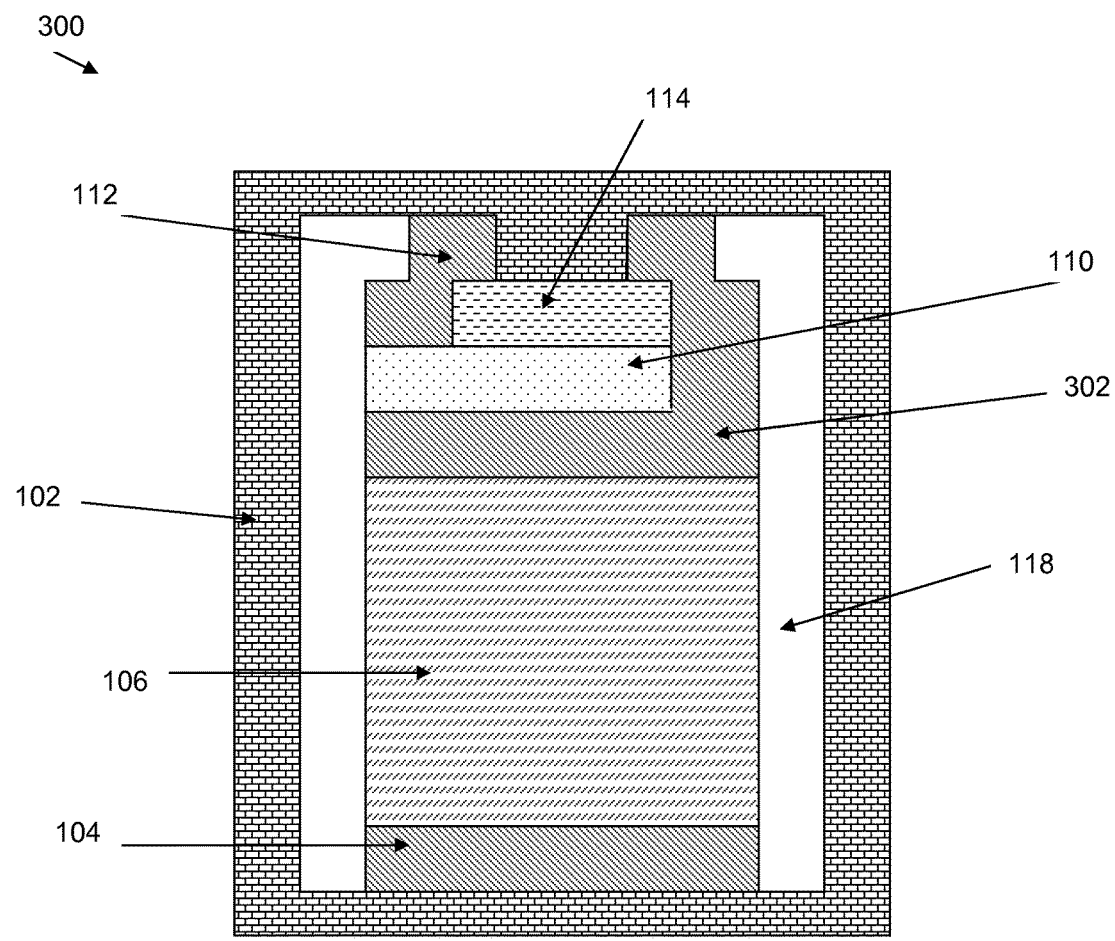
FIGS. 3 & 4 are schematic cross-sectional diagrams of three-terminal piezoelectronic transistors (3PET), according to embodiments of the present invention, showing a common electrode and sense electrodes that wrap the PR layer.
Figure 4:
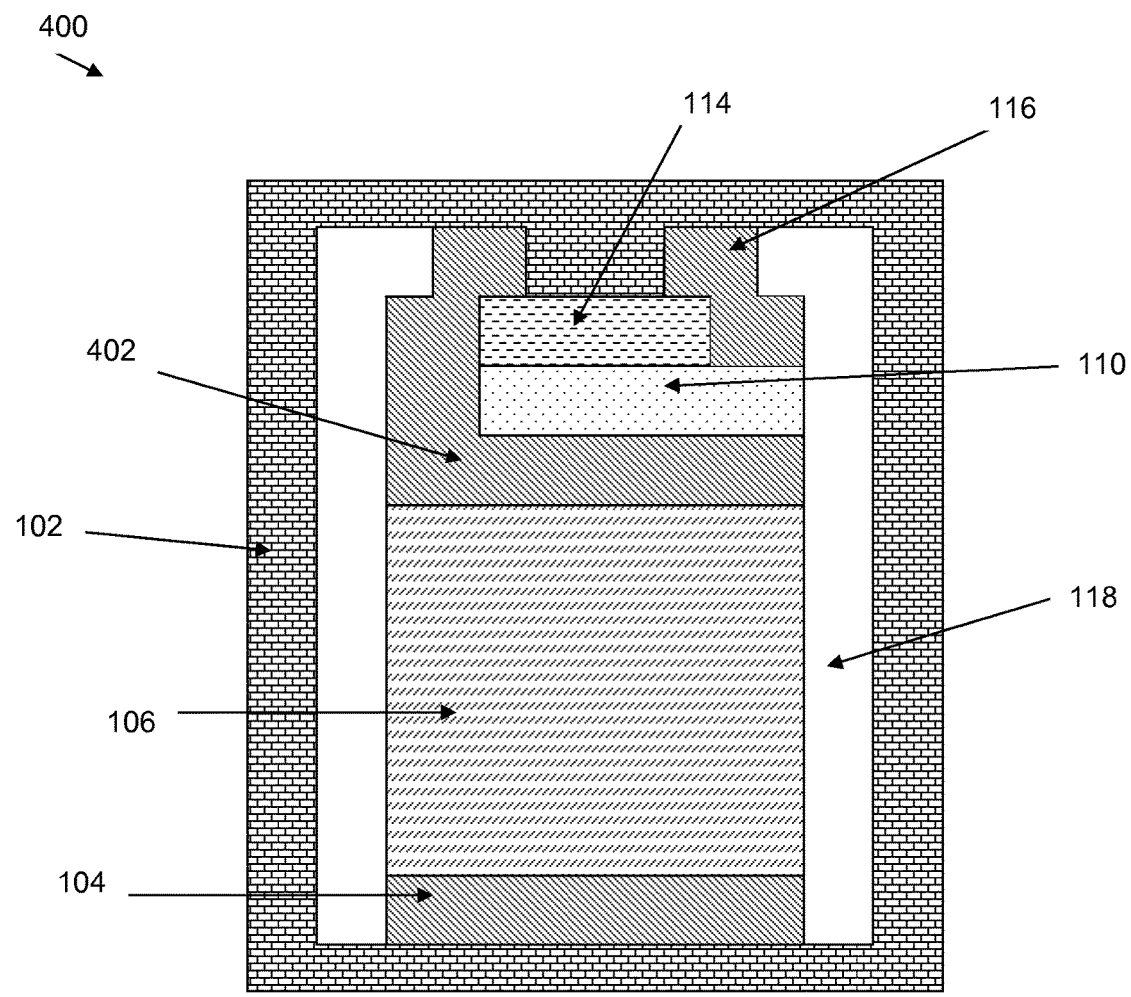

FIG. 3 depicts a cross-sectional diagram of a 3PET 300, according to embodiments of the present invention. The design in FIG. 3 is a modification to the design in FIG. 2. 3PET 300 initially includes a PE layer 106 disposed on a first gate electrode 104 and a second gate electrode 108 disposed on PE layer 106. An insulator layer 110 is then disposed on second gate electrode 108. A first sense electrode 112, a PR layer 114, and a second sense electrode 116 are then disposed on insulator layer 110. A HYSM 102 surrounds and encapsulates all of the components described above. Again, there is a gap or vacant space 118 between the various layers of the PET and the sides of HYSM 102. However, where 3PET 300 departs from 4PET 200 is that there is a connection between one of the PR layer sense electrodes and the adjacent PE layer gate electrode, forming a common electrode for the device. For example, second sense electrode 116 and second gate electrode 108 form a connection and result in common electrode 302. Alternatively, a common electrode 402 could be formed by a connection between first sense electrode 112 and second gate electrode 108, as depicted in FIG. 4.

What was once a 4 terminal design in 4PET 200 becomes a 3 terminal design in 3PET 300. The arrangement of the components are similar to 4PET 200, except now, 3PET 200 includes a PE layer 106 disposed on a first gate electrode 104 and a common electrode 302 disposed on PE layer 106. Insulator layer 110 is disposed on common electrode 302. First sense electrode 112 and PR layer 114 are disposed on insulator layer 110. A portion of first sense electrode 112 wraps the left side of PR layer 114 and the remaining portion of first sense electrode 112 wraps the top side of PR layer 114. A portion of common electrode 302 wraps the right side of insulator layer 110 and the right side of PR layer 114. A further portion of common electrode 302 wraps the top side of PR layer 114.

The portions of first sense electrode 112 and common electrode 302 that wrap the top side of PR layer 114 are separated from each other in the transverse direction by a distance, just as in 4PET 200. Again, the top of HYSM 102 separates the sense and common electrodes and contacts the top of PR layer at the distance between them.

As in 4PET 200, between the top of HYSM 102 and the portions of first sense electrode 112 and common electrode 302 that wrap the left and right side of PR layer 114 there is a gap or void space.

FIG. 4 depicts a schematic cross-sectional diagram of 3PET 400, according to embodiments of the present invention. The design is an alternative design to 3PET 300. The difference between 3PET 300 and 3PET 400 are the electrodes that form the common electrode. In 3PET 400, first sense electrode 112 and second gate electrode 108 form a connection and result in common electrode 402. A portion of second sense electrode 116 wraps the right side of PR layer 114 and the remaining portion of second sense electrode 116 wraps the top side of PR layer 114. A portion of common electrode 402 wraps the left side of insulator layer 110 and the left side of PR layer 114. A further portion of common electrode 402 wraps the top side of PR layer 114. The other features of 3PET 300 are also present in 3PET 400.

Figure 5:
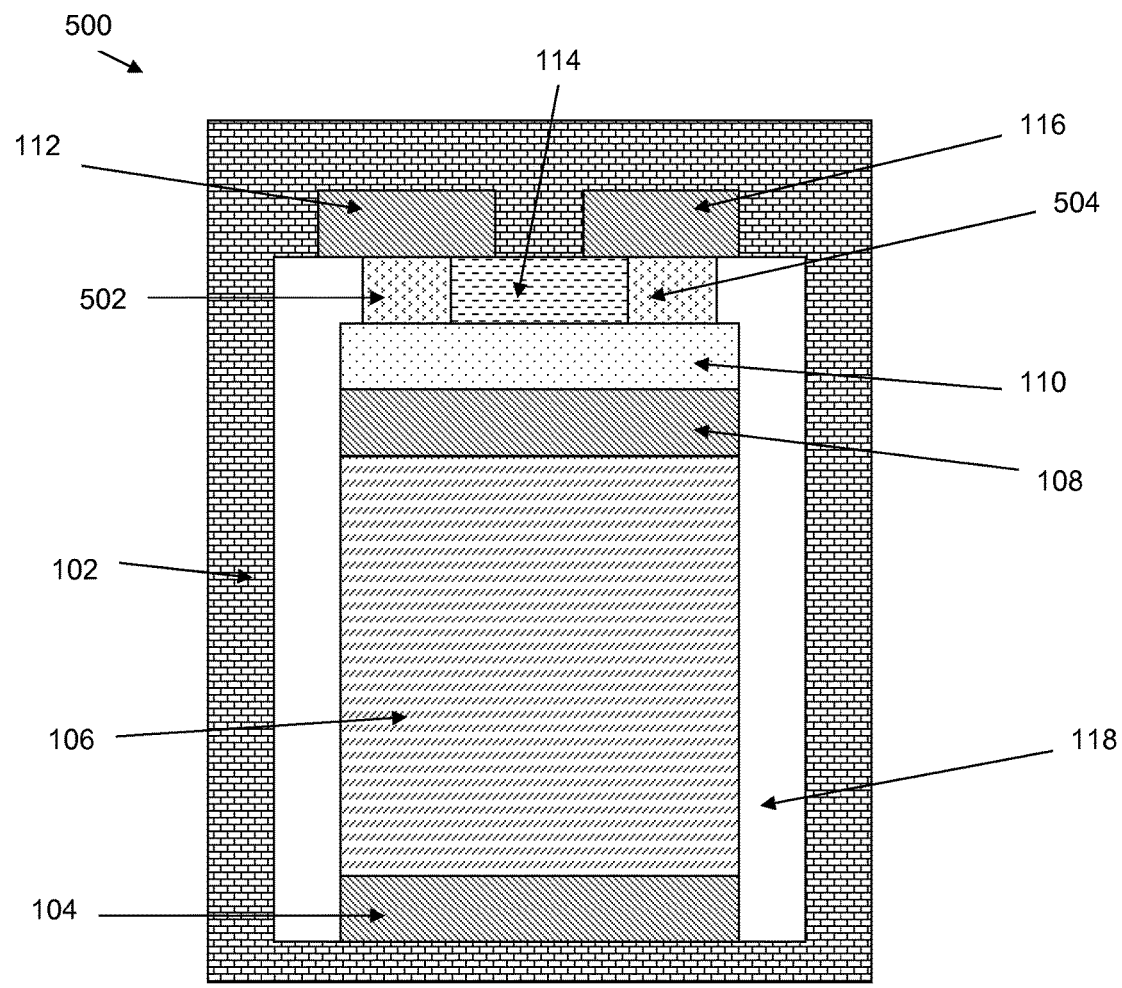
FIG. 5 is a schematic cross-sectional diagram of a 4PET, according to an embodiment of the present invention, where sense electrodes are embedded in a high yield strength material (HYSM) with additional soft conductors on the sides of the PR layer.

FIG. 5 depicts a schematic cross-sectional diagram of a 4PET 500, according to embodiments of the present invention. It is a variation on the design of 4PET 200. 4PET 500 includes a PE layer 106 disposed on a first gate electrode 104 and a second gate electrode 108 disposed on PE layer 106. An insulator layer 110 is then disposed on second gate electrode 108. A PR layer 114 is disposed on insulator layer 110. However, where 4PET 500 departs from 4PET 200 is in the location of first sense electrode 112 and second sense electrode 116. 4PET 500 also adds a first soft conducting layer 502 and a second soft conducting layer 504 to the design.

In 4PET 500, first soft conducting layer 502 and second soft conducting layer 504 are disposed on insulator layer 110. First soft conducting layer 502 is in contact with the left side of PR layer 114. Second soft conducting layer 504 is in contact with the right side of PR layer 114. First sense electrode 112 and second sense electrode 116 are embedded in the top of HYSM 102 that surrounds and encapsulates all of the components described above. Just like in the other PET designs discussed, there is a gap or vacant space 118 between the various layers of the PET and the sides of HYSM 102.

First sense electrode 112 contacts both first soft conducting layer 502 and the top of PR layer 114. Second sense electrode 116 contacts both second soft conducting layer 504 and the top of PR layer 114. First sense electrode 112 and second sense electrode 116 are separated from each other in the transverse direction by a distance, just as in FIGS. 2-4. Again, the top of HYSM 102 separates the sense electrodes and contacts the top of the PR layer at the distance between them.

The purpose of soft conducting layers 502 & 504 is to maintain electrical contact between the sense electrodes and the PR layer in the event the sense electrodes detach from the PR layer at the contact surfaces between them. Such a detachment could be caused by metal fatigue in the sense electrodes. As a measure to prevent metal fatigue, the yield strength of first and second soft conducting layers 502 & 504 should be smaller than the yield strength of both sense electrodes 112 & 116 and PR layer 114.

Figure 6:
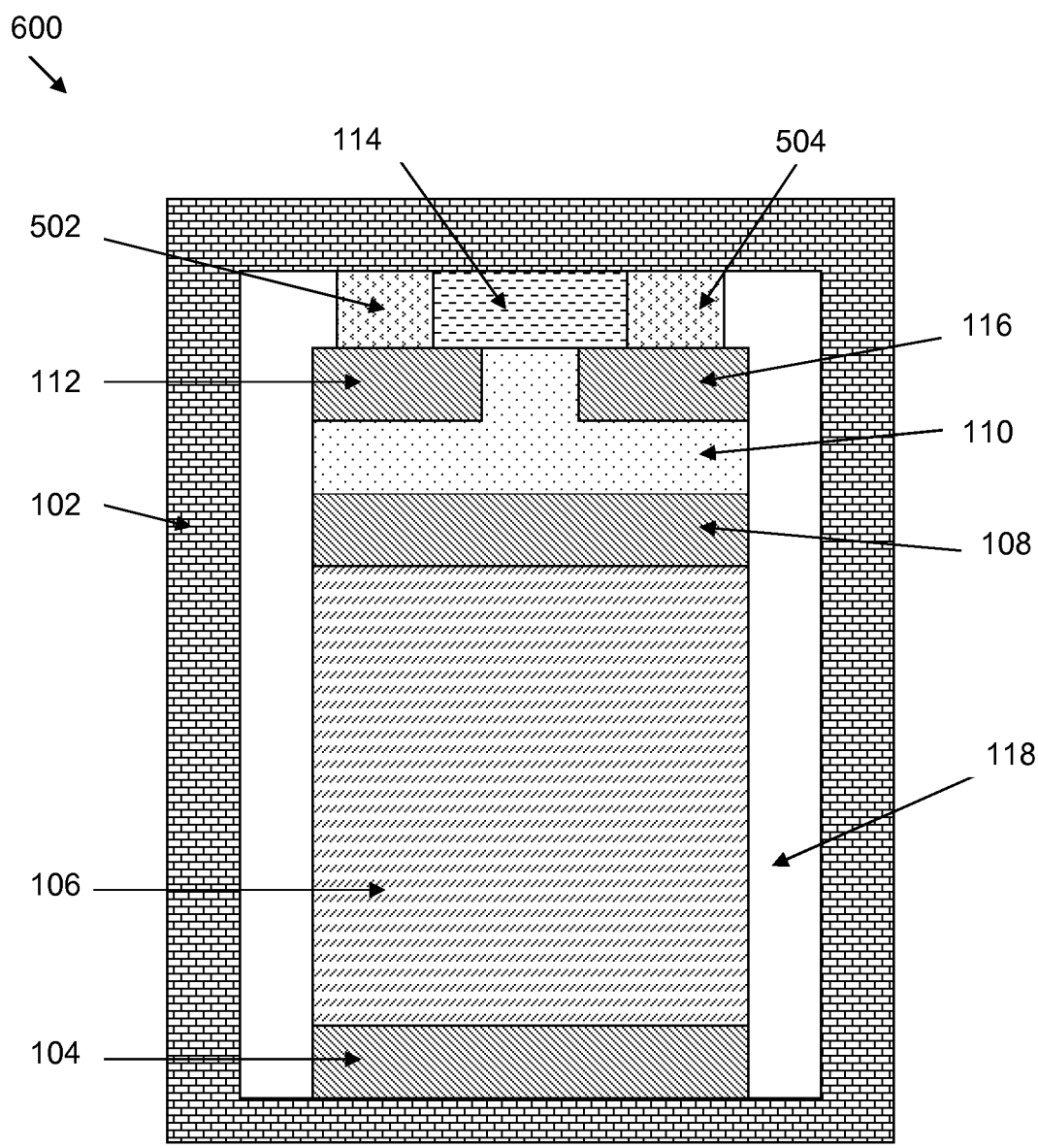
FIG. 6 is a schematic cross-sectional diagram of a 4PET, according to an embodiment of the present invention, where sense electrodes are embedded in an insulator below the PR layer with soft conductors on the sides of the PR layer.

FIG. 6 depicts a schematic cross-sectional diagram of a 4PET 600, according to embodiments of the present invention. It is a variation on the design of 4PET 500. 4PET 600 includes a PE layer 106 disposed on first gate electrode 104 and second gate electrode 108 disposed on PE layer 106. An insulator layer 110 is then disposed on second gate electrode 108. However, where 4PET 600 deviates from 4PET 500 is the location of sense electrodes 112 & 116.

First sense electrode 112 and second sense electrode 116 are embedded in insulator layer 110. PR layer 114 is disposed on insulator layer 110 so that the bottom of PR layer 114 is in contact with first sense electrode 112 and second sense electrode 116. First soft conducting layer 502 is disposed on first sense electrode 112 and second soft conducting layer 504 is disposed on second sense electrode 116. First soft conducting layer 502 contacts the left side of PR layer 114 and second soft conducting layer 504 contacts the right side of PR layer 114. The soft conducting layers serve the same function as in 4PET 500.

As in FIGS. 2-5, first sense electrode 112 and second sense electrode 116 are separated from each other in the transverse direction by a distance to minimize quantum tunneling. Now, insulator layer 110, as opposed to HYSM 102, separates the sense electrodes and contacts the bottom of PR layer at the distance between them.

A HYSM 102 surrounds and encapsulates all of the components described above. Again, there is a gap or vacant space 118 between the various layers of the PET and the sides of HYSM 102.

The proposed embodiments have a means to amplify the pressure on the PR layer during expansion of the PE layer through the ratio of adjacent areas. Pressure amplification is important because the PE layer can only exert a certain maximum pressure which may not be enough to significantly change the resistance in the PR layer.

The minimization of quantum tunneling by separating the sense electrodes from each other by a distance in the transverse direction allows for a thinner PR layer and therefore a lower voltage and expansion of the PE layer to achieve the same pressure on the PR layer. These transverse sensing designs, in FIGS. 2-6, allow the PETs to function as a switch or memory because resistance changes in the PR layer are independent of the direction of the compression for materials considered in the prior art.

The designs in FIGS. 2-6 confine the sense current to move through the thin cross-section of the PR layer, which can increase the resistance when compared to FIG. 1. Such an increase can be offset by increasing the width of the PR layer in the third dimension (into the page of the figures), decreasing the resistivity of the PR layer through the use of different materials or doping, and/or using a higher PR pressure.

As an alternative or additional measure to prevent metal fatigue in the sense electrodes in FIGS. 2-6 above, the sense electrodes can be coated with a thin layer of a hard conducting film. An example of such coating is in Copper technology, where tantalum is used as a liner material to protect the Copper from metal fatigue.

The improvement of the designs in FIGS. 2-6 over that in FIG. 1 can be seen from the relationship between pressure, P, voltage, V, and PR thickness, l, which is:

$$P = d_{33} V / (l/Y_{PR} + d/Y_{PE})$$

where $d_{33}$ is the displacement per volt in the PE, d=La/A is a reduced length equal to the PE thickness L multiplied by the ratio of PR area a to PE area A, and the Y are Young's moduli for the PR and PE. This relationship indicates that a lower PR thickness allows a lower voltage on the PE to give the same PR pressure and resistance drop. For the parameters in the above equation, where A/a=9 or 25, l/L=0.075, and $Y_{PE}/Y_{PR}$=1.5, the voltage for the same P decreases by a factor of 0.75 or 0.63, respectively, when the PR thickness decreases from 4 nm to 2 nm at the same L. Such a thickness decrease would be undesirable in FIG. 1 because a PR 2 nm thick would have severe quantum tunneling. Alternatively, for the same voltage, the pressure increases by the inverse of these factors at lower PR thickness, and that allows a higher ON/OFF ratio for the PET with an exponential sensitivity on P.

If the decreased PR thickness is accompanied by an equal fractional decrease in all of the PET dimensions, then d also decreases by the same amount, and that would allow a factor of 2 lower voltage for the same pressure in the above example.

The impact on the RC time constant would remain the same if the resistivity in the PR is lowered for the new designs. For perpendicular currents as in FIG. 1, the resistance in the PR is $\rho_1 l/a$ for resistivity $\rho_1$. For transverse currents as in FIGS. 2-6, the resistance is $\rho_2 w_x/(w_y l)$ for width $w_x$ in the horizontal direction in the figure, and width $w_y$ into the page. If $a = w_x w_y$ in FIG. 1, then the ratio of the new resistance to the old resistance is $(\rho_2/\rho_1)(w_x/l)^2$. This ratio is unity if $\rho_2/\rho_1 = (l/w_x)^2 < 1$. The capacitance in the expression for RC time is the capacitance in the PE. If that is unchanged because A and L are unchanged, then the RC time in the new design will be the same as in FIG. 1 if the resistivity is decreased by the factor $(l/w_x)^2$, which can be accomplished by material change or doping. If all of the PET dimensions decrease in the same proportion, $\alpha < 1$, then the RC time for a design like FIG. 1 will decrease with this proportion if the resistivity does as well. The same is true for scale changes in the new design. In this case, the sonic and RC frequencies both increase as the inverse of the scaling factor $\alpha$, the circuit density increases as $1/\alpha^2$, the voltage decreases as $\alpha$, and the power density remains the same.

The embodiments propose designs where the PR layer is sensed in a direction perpendicular to its compression, allowing the distance between the sense electrodes to be much larger than the thickness of the PR layer. This helps to minimize quantum tunneling. Further, designs are proposed with arbitrary widths for the PE and PR layers that amplify pressure on the PR layer using a small contact region. Further designs allow for transverse actuation of the PE layer, allowing greater flexibility to the choice of PE contact area with PR layer.

Figure 7:
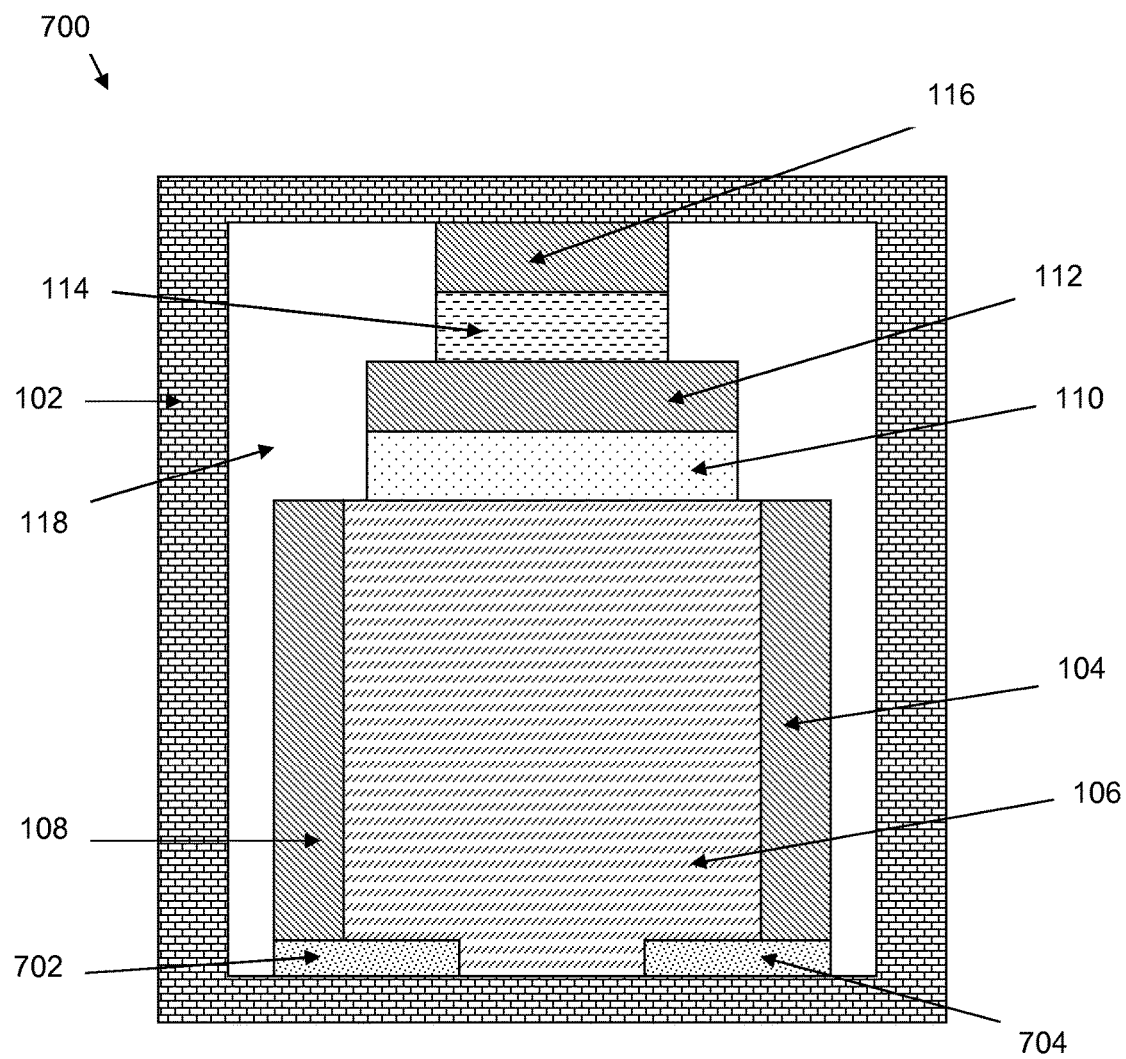
FIG. 7 is a schematic cross-sectional diagram of a 4PET design, according to an embodiment of the present invention, where a piezoelectric (PE) layer is actuated in the transverse direction.

According to embodiments of the present invention, FIG. 7 shows a cross-sectional diagram of a 4PET 700 where the PE layer is actuated in the transverse direction. The design uses the $d_{31}$ coefficient of the PE layer to drive the PE and PR motions perpendicular to the applied field. The $d_{31}$ coefficient for displacement per Volt is typically smaller by a factor of 0.4 than the parallel $d_{33}$ coefficient, but the PR compression can still be high if the ratio of the adjacent PE and PR cross-sectional areas is high (e.g. 25). The PE layer is grown with 100 orientation instead of with 001 orientation as seen in the prior art.

4PET 700 modifies the design of 4PET 100 by its placement of the first and second gate electrodes. A PE layer 106 is disposed between first gate electrode 104 and second gate electrode 108. First gate electrode 104 wraps the right side of PE layer 106 and second gate electrode 108 wraps the left side of PE layer 106. First gate electrode 104 is disposed on a first soft spacing layer 704 and second gate electrode 108 is disposed on a second soft spacing layer 702. PE layer 106 is partially disposed on both soft spacing layers 702 & 704. An Insulator layer 110 is disposed on PE layer 106 and separates PE layer 106 from a first sense electrode 112. A PR layer 114 is disposed between first sense electrode 112 and a second sense electrode 116. A HYSM 102 surrounds and encapsulates all of the components described above. There is a gap or vacant space 118 between the various layers of the PET and the sides of HYSM 102.

Soft spacing layers 702 & 704 partially separate PE layer 106 from the bottom of HYSM 102. This allows for slippage as PE layer 106 expands and contracts. For this soft spacing layer, dielectrics with elastic modulus less than 10 GPa can be used, for example, organosilicate glass SiCOH from plasma enhanced chemical vapor deposition, organic material such as polyimides, silsesquioxane, benzocyclobutene and aromatic thermosets from spin-on deposition, and many other low dielectric constant materials and their porous versions with lower Young's modulus.

The transverse actuation of the PE layer in FIG. 7 provides greater flexibility to the choice of PE contact area with the PR. In FIG. 1, the contact area at the first sense electrode is the same as the charging area for the PE layer. Increasing the contact area to gain mechanical advantage for compression of the PR layer also increases the capacitance of the PE layer, which slows down the circuit through the RC time. In FIG. 7, the contact areas and the charging areas are independent.

Figure 8:
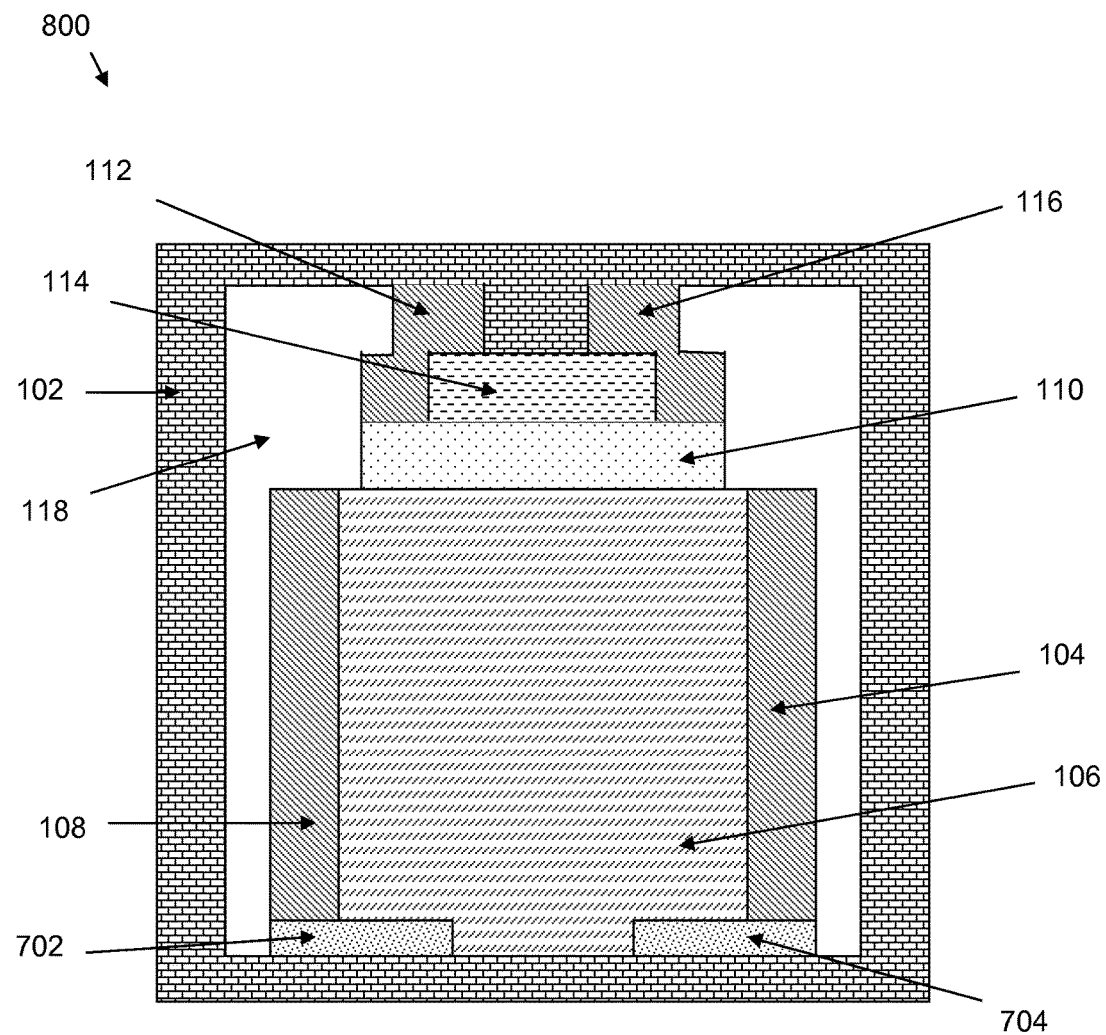
FIG. 8 is a schematic cross-sectional diagram of a 4PET design, according to an embodiment of the present invention, where the PE layer is actuated in the transverse direction and sense electrodes wrap a piezoresistive (PR) layer.

Another embodiment of the present invention builds upon the design in FIG. 7 by arranging the layers of the PET so the PR layer has sense electrodes that control current in the transverse direction. FIG. 8 shows a cross-sectional diagram of a 4PET 800. 4PET 800 includes a PE layer 106 disposed between first gate electrode 104 and second gate electrode 108. First gate electrode 104 wraps the right side of PE layer 106 and second gate electrode 108 wraps the left side of PE layer 106. First gate electrode 104 is disposed on a first soft spacing layer 704 and second gate electrode 108 is disposed on a second soft spacing layer 702. PE layer 106 is partially disposed on both soft spacing layers 702 & 704. An insulator layer 110 is then disposed on PE layer 106. A first sense electrode 112, a PR layer 114, and a second sense electrode 116 are then disposed on insulator layer 110. A HYSM 102 surrounds and encapsulates all of the components described above. Again, there is a gap or vacant space 118 between the various layers of the PET and the sides of HYSM 102.

Where FIG. 8 modifies the design of FIG. 7 is in the configuration of first and second sense electrodes 112 & 116 in relation to PR layer 114. In FIG. 8, first sense electrode 112 and second sense electrode 116 share the same plane. A portion of first sense electrode 112 wraps the left side of PR layer 114 and the remaining portion of first sense electrode 112 wraps the top side of PR layer 114. A portion of second sense electrode 116 wraps the right side of PR layer 114 and the remaining portion of second sense electrode 116 wraps the top side of PR layer 114. The placement of the sense electrodes in this manner allows for maximum electrical contact between the PR layer and the sense electrodes.

The portions of first and second sense electrodes 112 & 116 that wrap the top of PR layer 114 are separated from each other in the transverse direction by a distance. The top of HYSM 102 separates the sense electrodes and contacts the top of PR layer at this distance between them. The distance should be large enough that quantum tunneling is minimized (e.g., 4 nm).

Between the top of HYSM 102 and the portions of the first and second sense electrodes 112 & 116 that wrap the left and right side of PR layer 114 there is a gap or void space. As a result, the sense electrodes' resistance to the expansion of the PE layer is minimal.

Figure 9:
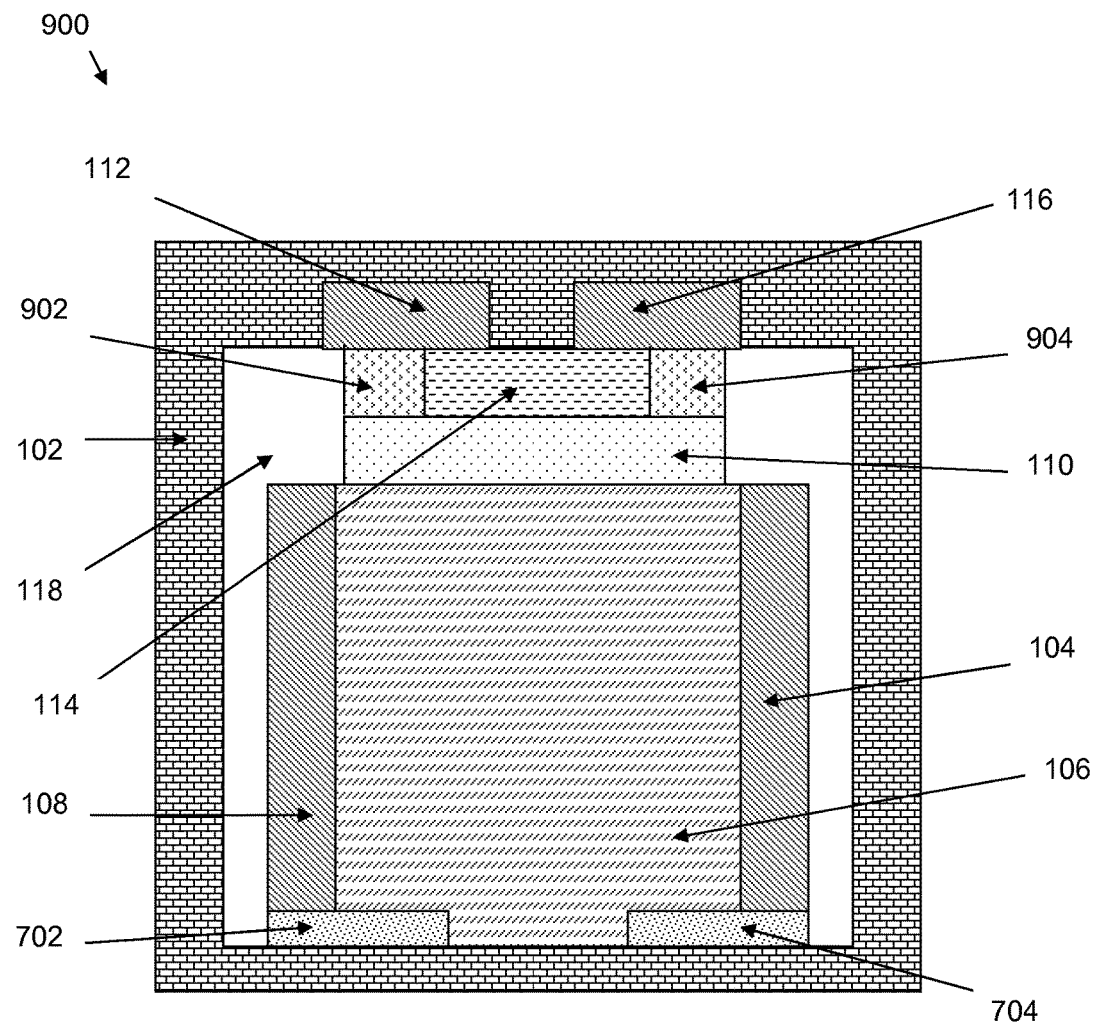
FIG. 9 is a schematic cross-sectional diagram of a 4PET design, according to an embodiment of the present invention, where the PE layer is actuated in the transverse direction and sense electrodes are embedded in a high yield strength material (HYSM) with additional soft conductors on the sides of the PR layer.

FIG. 9 depicts a schematic cross-sectional diagram of a 4PET 900, according to embodiments of the present invention. It is a variation on the design of 4PET 800. 4PET 900 includes a PE layer 106 disposed between first gate electrode 104 and second gate electrode 108. First gate electrode 104 wraps the right side of PE layer 106 and second gate electrode 108 wraps the left side of PE layer 106. First gate electrode 104 is disposed on a first soft spacing layer 704 and second gate electrode 108 is disposed on a second soft spacing layer 702. PE layer 106 is partially disposed on both soft spacing layers 702 & 704. An insulator layer 110 is then disposed on PE layer 106. A PR layer 114 is disposed on insulator layer 110. However, where 4PET 900 departs from 4PET 800 is in the location of first sense electrode 112 and second sense electrode 116. 4PET 900 also adds a first soft conducting layer 902 and a second soft conducting layer 904 to the design.

In 4PET 900, first soft conducting layer 902 and second soft conducting layer 904 are disposed on insulator layer 110. First soft conducting layer 902 is in contact with the left side of PR layer 114. Second soft conducting layer 904 is in contact with the right side of PR layer 114. First sense electrode 112 and second sense electrode 116 are embedded in the top of HYSM 102 that surrounds and encapsulates all of the components described above. Just like in the other 4PET designs discussed, there is a gap or vacant space 118 between the various layers of the PET and the sides of HYSM 102.

First sense electrode 112 contacts both first soft conducting layer 902 and the top of PR layer 114. Second sense electrode 116 contacts both second soft conducting layer 904 and the top of PR layer 114. First sense electrode 112 and second sense electrode 116 are separated from each other in the transverse direction by a distance, just as in 4PET 800. Again, the top of HYSM 102 separates the sense electrodes and contacts the top of PR layer at the distance between them.

The purpose of soft conducting layers 902 & 904 is to maintain electrical contact between the sense electrodes and the PR layer in the event the sense electrodes detach from the PR layer at the contact surfaces between them. Such a detachment could be caused by metal fatigue in the sense electrodes. As a measure to prevent metal fatigue, the yield strength of first and second soft conducting layers 902 & 904 should be smaller than the yield strength of both sense electrodes 112 & 116 and PR layer 114.

Figure 10:
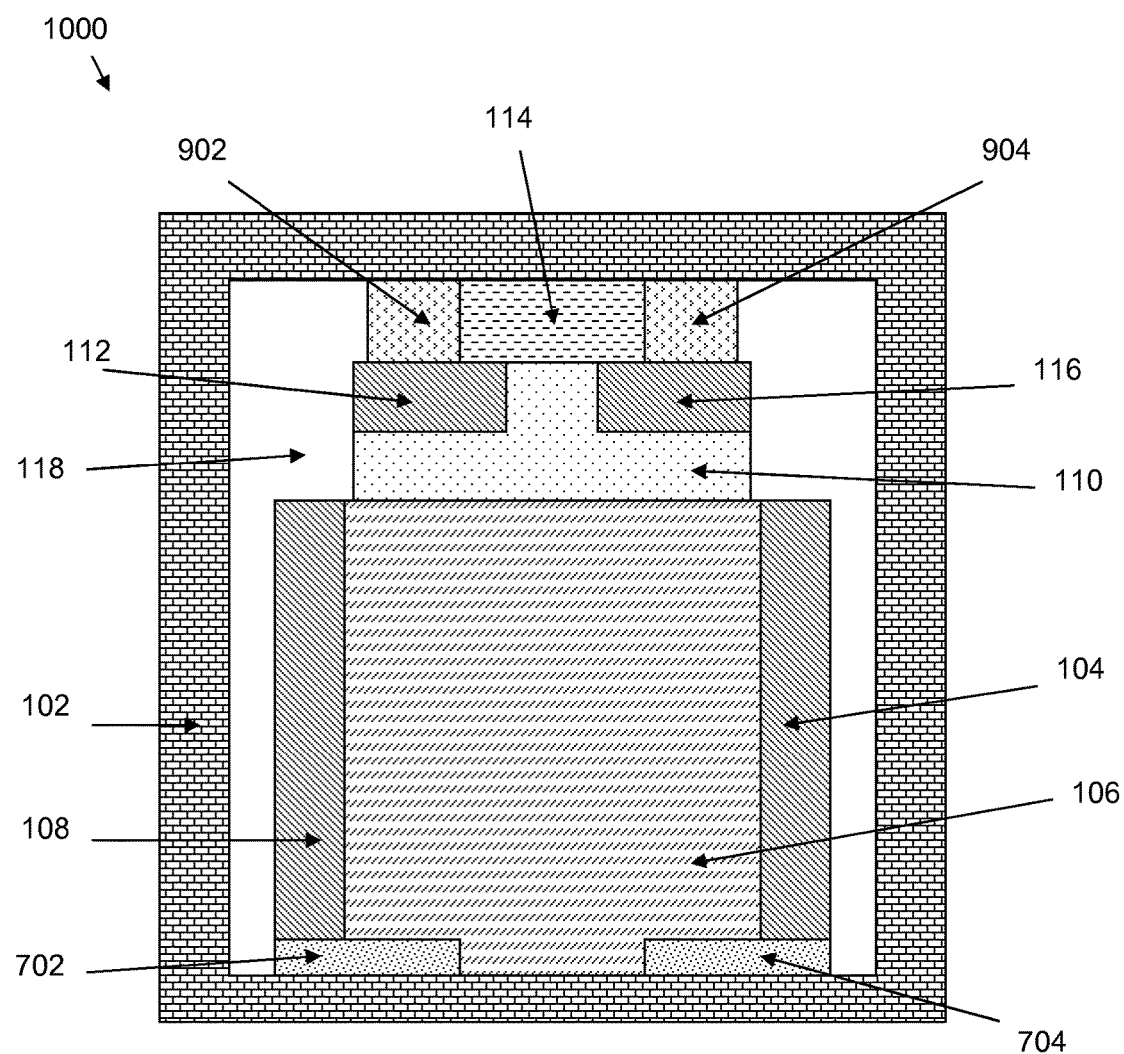
FIG. 10 is a schematic cross-sectional diagram of a 4PET design, according to an embodiment of the present invention, where the PE layer is actuated in the transverse direction and sense electrodes are embedded in an insulator below the PR layer.

FIG. 10 depicts a schematic cross-sectional diagram of a 4PET 1000, according to embodiments of the present invention. It is a variation on the design of 4PET 900. 4PET 1000 includes a PE layer 106 disposed between first gate electrode 104 and second gate electrode 108. First gate electrode 104 wraps the right side of PE layer 106 and second gate electrode 108 wraps the left side of PE layer 106. First gate electrode 104 is disposed on a first soft spacing layer 704 and second gate electrode 108 is disposed on a second soft spacing layer 702. PE layer 106 is partially disposed on both soft spacing layers 702 & 704. An insulator layer 110 is then disposed on PE layer 106. However, where 4PET 1000 deviates from 4PET 900 is the location of sense electrodes 112 & 116.

First sense electrode 112 and second sense electrode 116 are embedded in insulator layer 110. PR layer 114 is disposed on insulator layer 110, so that the bottom of PR layer 114 is in contact with first sense electrode 112 and second sense electrode 116. First soft conducting layer 902 is disposed on first sense electrode 112 and second soft conducting layer 904 is disposed on second sense electrode 116. First soft conducting layer 902 contacts the left side of PR layer 114 and second soft conducting layer 904 contacts the right side of PR layer 114. The soft conducting layers serve the same function as in 4PET 900.

As in FIGS. 8 & 9, first sense electrode 112 and second sense electrode 116 are separated from each other in the transverse direction by a distance to minimize quantum tunneling. Now, insulator layer 110, as opposed to HYSM 102, separates the sense electrodes and contacts the bottom of PR layer at the distance between them.

HYSM 102 surrounds and encapsulates all of the components described above. Again, there is a gap or vacant space 118 between the various layers of the PET and the sides of HYSM 102.

The minimization of quantum tunneling by separating the sense electrodes from each other by a distance in the transverse direction allows for a thinner PR layer and therefore a lower voltage and expansion of the PE layer to achieve the same pressure on the PR layer. These transverse sensing designs, in FIGS. 8-10, allow the PETs to function as a switch or memory because resistance changes in the PR layer are independent of the direction of the compression for materials considered in the prior art.

The designs in FIGS. 8-10 confine the sense current to move through the thin cross-section of the PR layer, which can increase the resistance when compared to FIG. 1. Such an increase can be offset by increasing the width of the PR layer in the third dimension (into the page of the figures), decreasing the resistivity of the PR layer through the use of different materials or doping, and/or using a higher PR pressure.

The improvement of the designs in FIGS. 7-10 over that in FIG. 1 can be seen from the relationship between pressure, P, voltage, V, and PR thickness, l, which is:

$$P = d_{31}V/(l/Y_{PR} + d/Y_{PE})$$

where $d_{31}$ is the displacement per volt in the PE, d=La/A is a reduced length equal to the PE thickness L multiplied by the ratio of PR area a to PE area A, and the Y are Young's moduli for the PR and PE. This relationship indicates that a lower PR thickness allows a lower voltage on the PE to give the same PR pressure and resistance drop. For the parameters in the above equation, where A/a=9 or 25, l/L=0.075, and $Y_{PE}/Y_{PR}$=1.5, the voltage for the same P decreases by a factor of 0.75 or 0.63, respectively, when the PR thickness decreases from 4 nm to 2 nm at the same L. Such a thickness decrease would be undesirable in FIG. 1 because a PR 2 nm thick would have severe quantum tunneling. Alternatively, for the same voltage, the pressure increases by the inverse of these factors at lower PR thickness, and that allows a higher ON/OFF ratio for the PET with an exponential sensitivity on P.

If the decreased PR thickness is accompanied by an equal fractional decrease in all of the PET dimensions, then d also decreases by the same amount, and that would allow a factor of 2 lower voltage for the same pressure in the above example.

The impact on the RC time constant would remain the same if the resistivity in the PR is lowered for the new designs. For perpendicular currents as in FIG. 1, the resistance in the PR is $\rho_1 l/a$ for resistivity $\rho_1$. For transverse currents as in FIGS. 8-10, the resistance is $\rho_2 w_x/(w_y l)$ for width $w_x$ in the horizontal direction in the figure, and width $w_y$ into the page. If $a=w_x w_y$ in FIG. 1, then the ratio of the new resistance to the old resistance is $(\rho_2/\rho_1)(w_x/l)^2$. This ratio is unity if $\rho_2/\rho_1 = (l/w_x)^2 < 1$. The capacitance in the expression for RC time is the capacitance in the PE. If that is unchanged because A and L are unchanged, then the RC time in the new design will be the same as in FIG. 1 if the resistivity is decreased by the factor $(l/w_x)^2$, which can be accomplished by material change or doping. If all of the PET dimensions decrease in the same proportion, α<1, then the RC time for a design like FIG. 1 will decrease with this proportion if the resistivity does as well. The same is true for scale changes in the new design. In this case, the sonic and RC frequencies both increase as the inverse of the scaling factor α, the circuit density increases as $1/\alpha^2$, the voltage decreases as α, and the power density remains the same.

Figure 11:
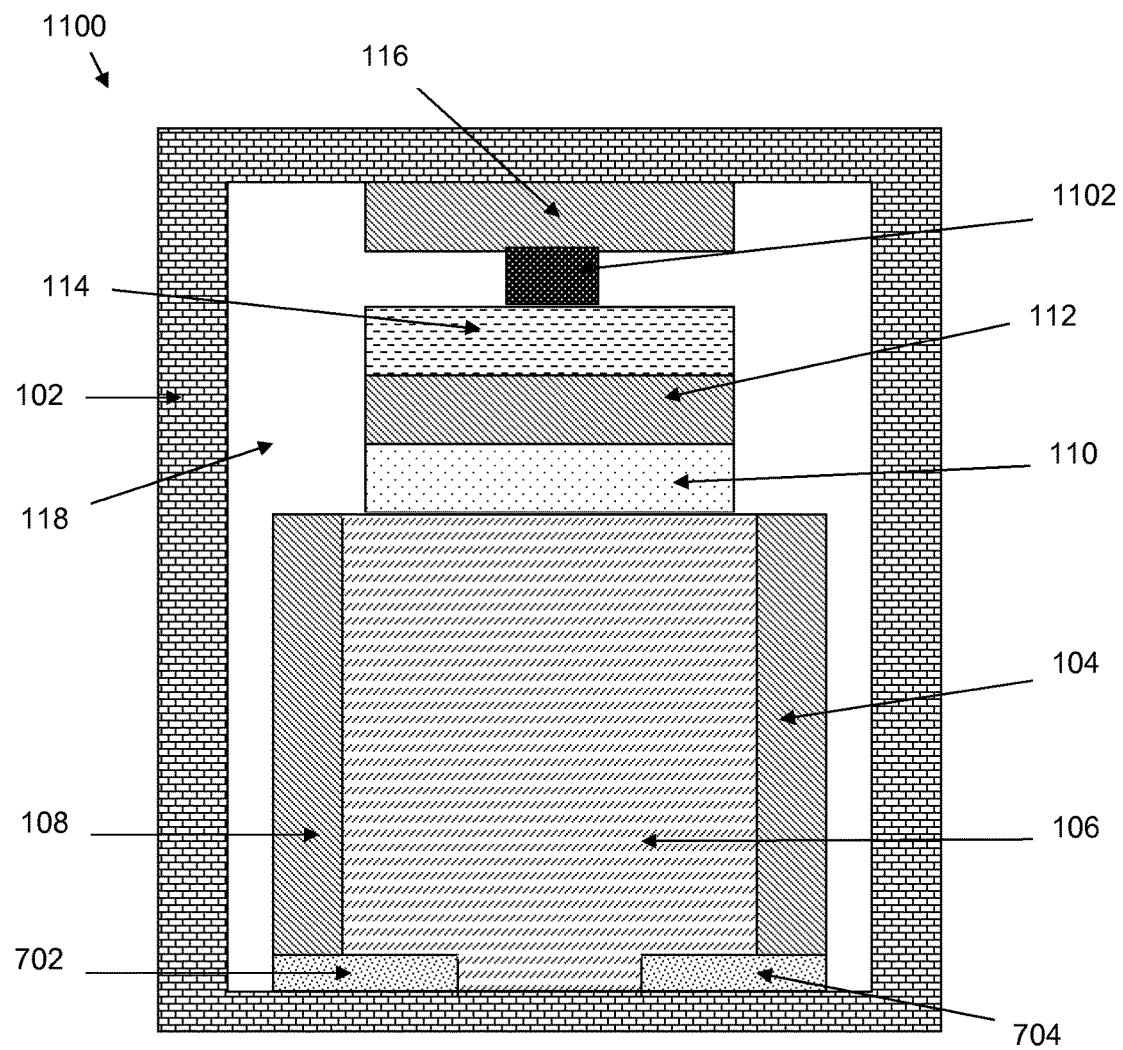
FIGS. 11 & 12 are schematic cross-sectional diagrams of 4PET designs, according to embodiments of the present invention, where the PE layer is actuated in the transverse direction and a conducting nanoparticle is located between a sense electrode and the PR layer.
Figure 12:
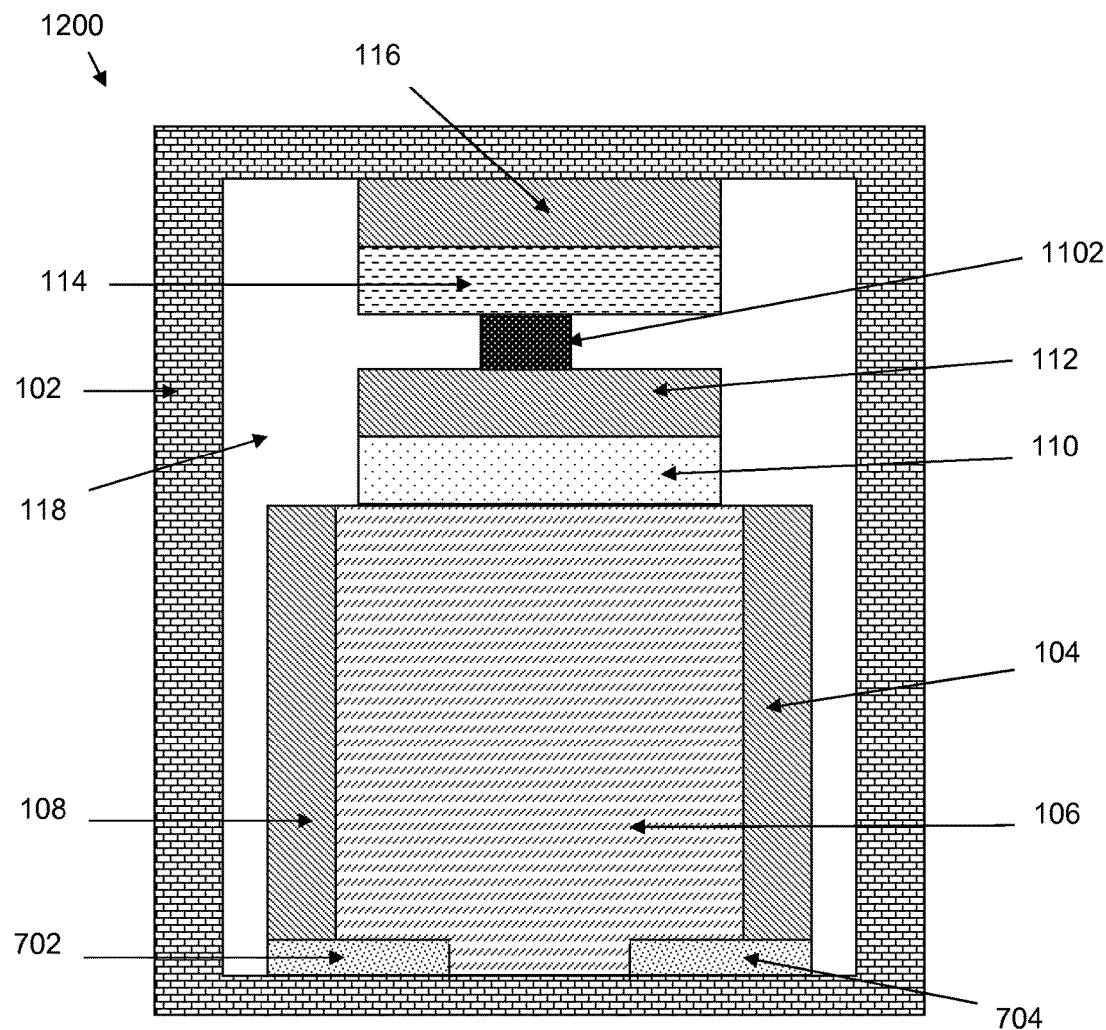

FIG. 11 is a schematic cross-sectional diagram of a 4PET 1100, according to embodiments of the present invention. The design is a modification of 4PET 700 that amplifies the pressure on the PR layer using a small contact region. 4PET 1100 includes a PE layer 106 disposed between first gate electrode 104 and second gate electrode 108. First gate electrode 104 wraps the right side of PE layer 106 and second gate electrode 108 wraps the left side of PE layer 106. First gate electrode 104 is disposed on a first soft spacing layer 704 and second gate electrode 108 is disposed on a second soft spacing layer 702. PE layer 106 is partially disposed on both soft spacing layers 702 & 704. An Insulator layer 110 is disposed on PE layer 106 and separates PE layer 106 from a first sense electrode 112. A PR layer 114 is disposed on first sense electrode 112. A conducting nanoparticle 1102 is disposed between PR layer 114 and a second sense electrode 116. Conducting nanoparticle 1102 acts as a small contact between PR layer 114 and second sense electrode 116. The nanoparticle's contact region with the PR layer is smaller than the contact region would be between the second sense electrode and the PR layer, if the nanoparticle were not included in the design. Thus, the area of the contact region between conducting nanoparticle 1102 and PR layer 114 is less than the area of the contact region between first sense electrode 112 and PR layer 114. The differing sizes of the area of the contact regions with the PR layer results in a pressure amplification on the PR layer when the PE layer expands. Conducting nanoparticle 1102 can be located between PR layer 114 and second sense electrode 116, as depicted in 4PET 1100, or it can be located between first sense electrode 112 and PR layer 114, as depicted by 4PET 1200 in FIG. 12. The nanoparticle that was between PR layer 114 and second sense layer 116 in 4PET 1100, is between first sense electrode 112 and PR layer 114 in 4PET 1200. Other than the location of the nanoparticle, and thus where the force amplification on the PR layer occurs, the components from 4PET 1100 are similarly arranged in 4PET 1200. A HYSM 102 surrounds and encapsulates all of the components discussed above. There is a gap or vacant space 118 between the various layers of the PET and the sides of HYSM 102.

Figure 13:
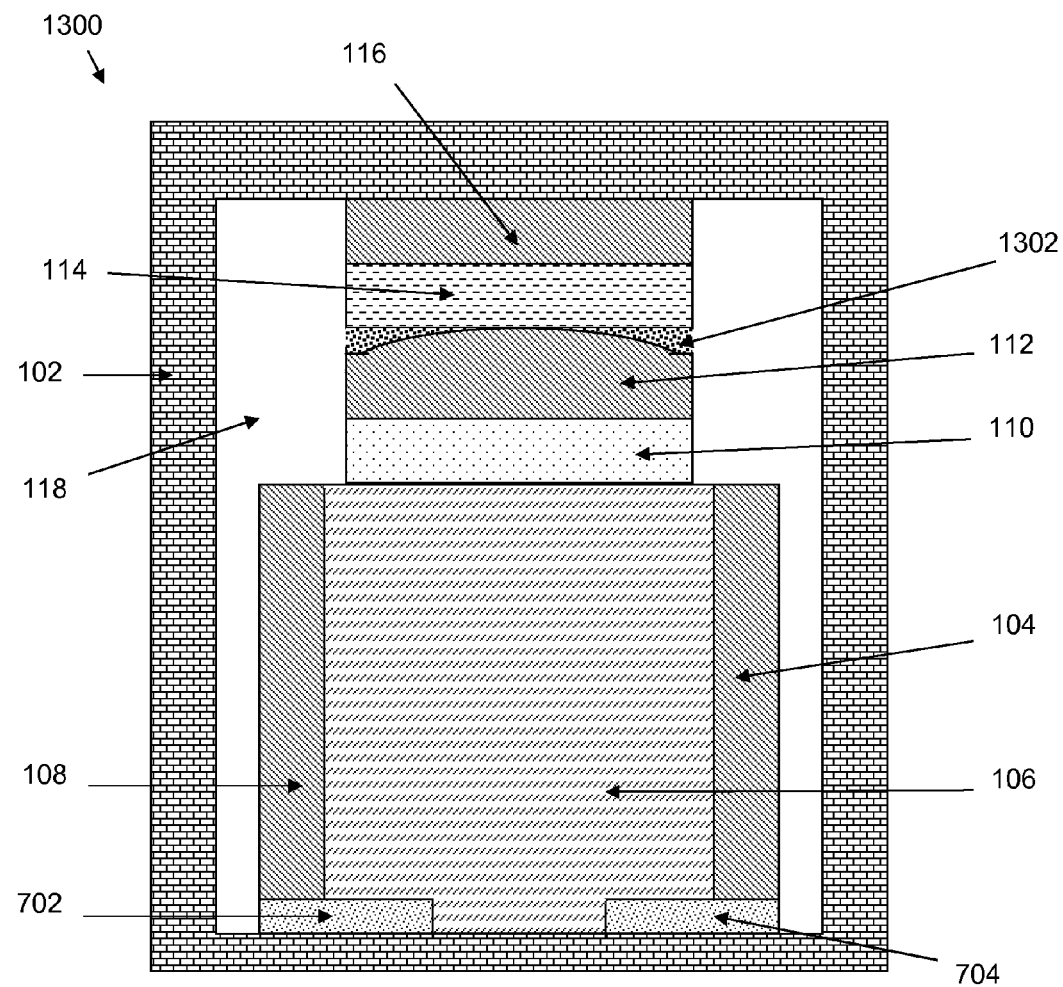
FIGS. 13 & 14 are schematic cross-sectional diagrams of 4PET designs, according to embodiments of the present invention, where the PE layer is actuated in the transverse direction and a pointed tip of a sense electrode is in contact with the PR layer.
Figure 14:
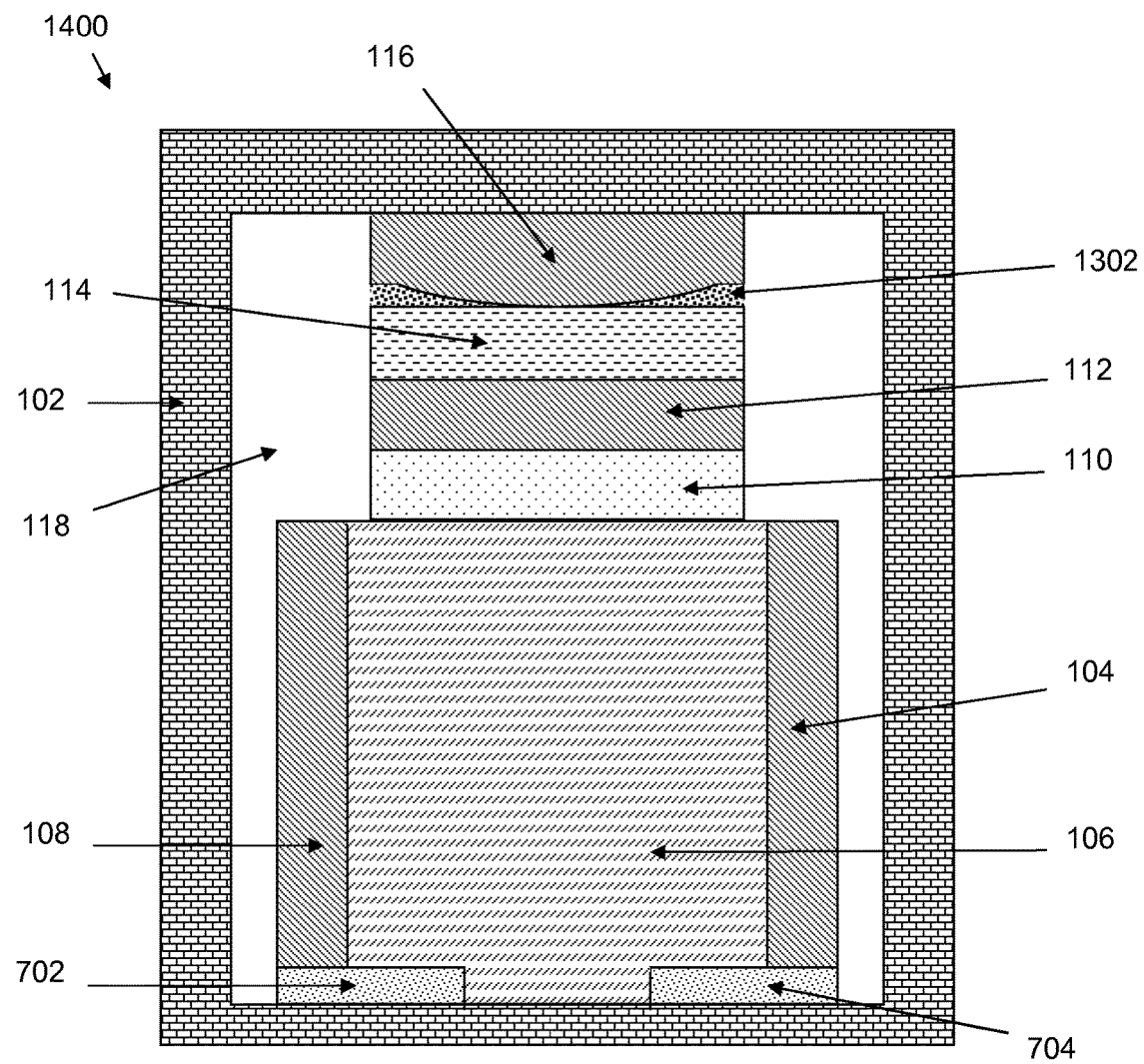

FIG. 13 is a schematic cross-sectional diagram of a 4PET 1300, according to embodiments of the present invention. The design is a modification of 4PET 1100 and 4PET 1200. In 4PET 1300, what differs is the small contact with the PR layer. In 4PET 1300, first sense electrode 112 has a pointed tip that serves as a small contact with PR layer 114. The pointed tip of first sense electrode 112 is in contact with PR layer 114. A void space or soft material 1302 separates PR layer 114 from the remainder of first sense electrode 112, so that only the pointed tip is in contact with PR layer 114. Thus, the area of the contact region between first sense electrode 112 and PR layer 114 is less than the area of the contact region between second sense electrode 116 and PR layer 114. The differing sizes of the areas of the contact regions with the PR layer results in a pressure amplification on the PR layer when the PE layer expands. As an alternative, the small contact with PR layer 114 could be a pointed tip of second sense electrode 116, as depicted by 4PET 1400 in FIG. 14. The void space or soft material 1302 would then separate PR layer 114 from the remainder of second sense electrode 116, so that only the pointed tip is in contact with PR layer 114. Second sense electrode 116 is the electrode with the pointed tip in contact with PR layer 114 in 4PET 1400, as opposed to first sense electrode 112 in 4PET 1300. Other than which sense electrode has the pointed tip in contact with the PR layer, and thus where the force amplification on the PR layer occurs, the components of 4PET 1400 are similarly arranged as in 4PET 1300. The pointed tip can be made, for example, by side etching the sense electrode after it is deposited.

Figure 15:
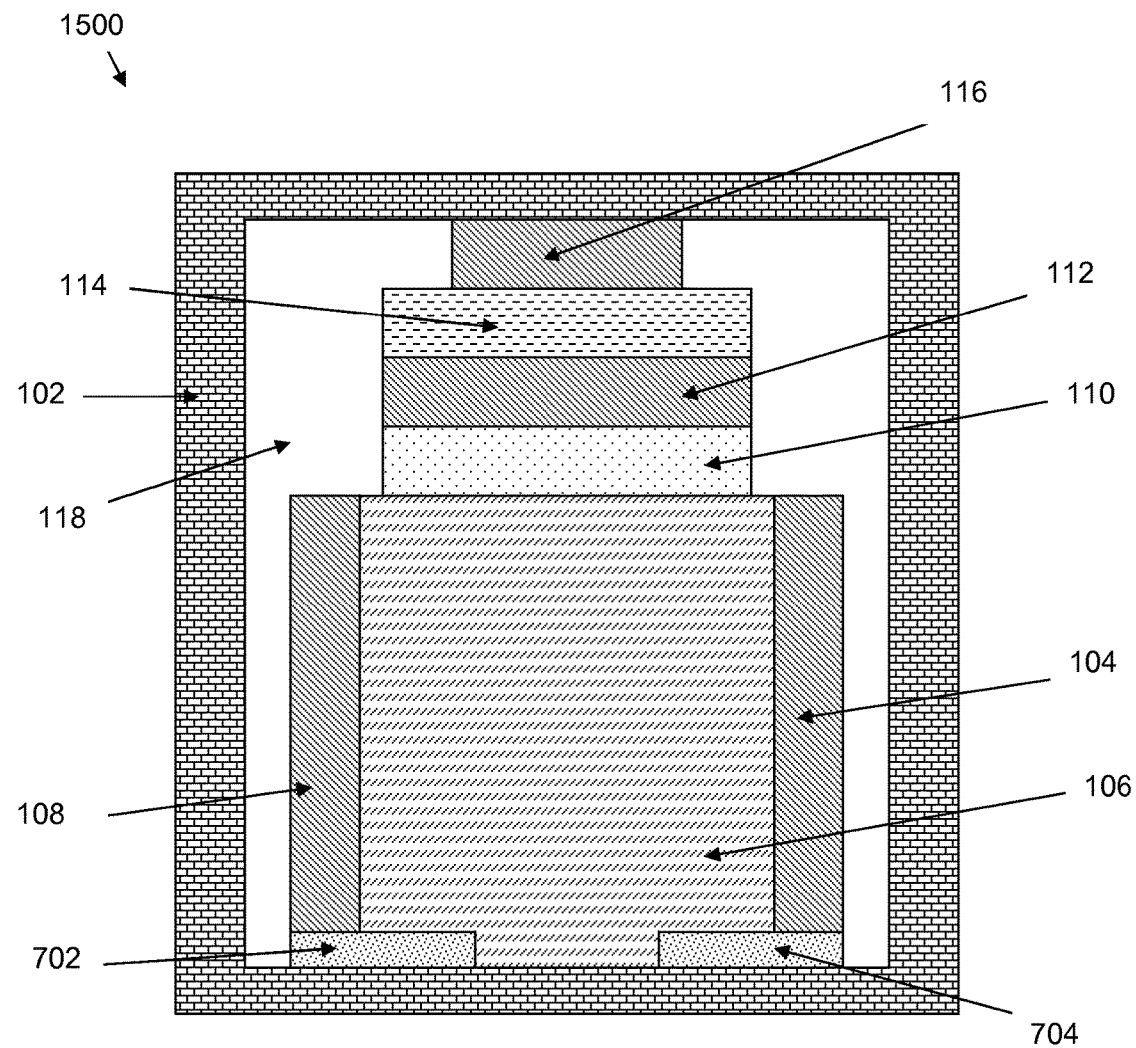
FIGS. 15 & 16 are schematic cross-sectional diagrams of 4PET designs, according to embodiments of the present invention, where the PE layer is actuated in the transverse direction and the area of the contact region between one sense electrode and the PR layer is less than the area of the contact region between the other sense electrode and the PR layer.
Figure 16:
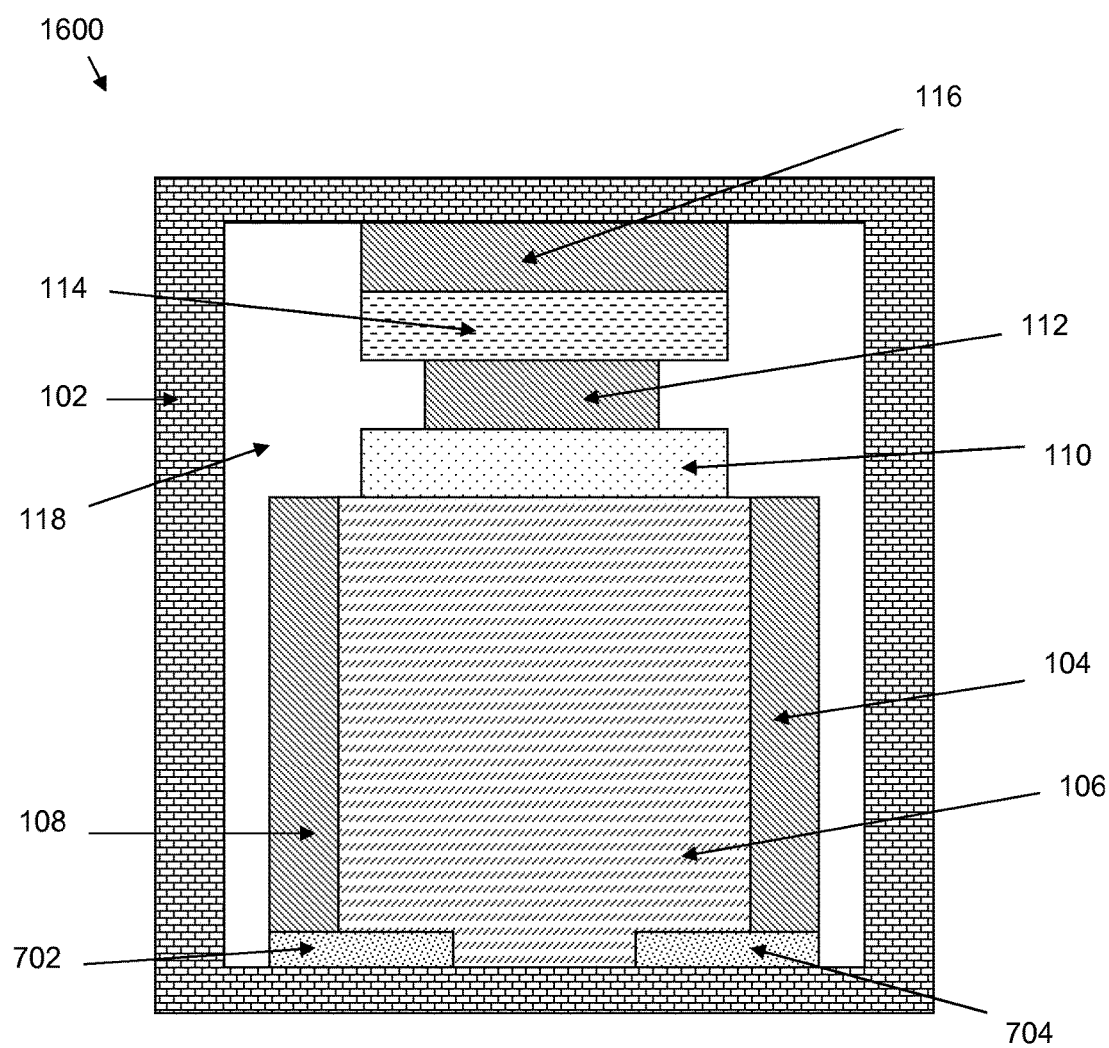

FIG. 15 is yet another variation on localized compression on the PR layer described in the previous four figures. FIG. 15's depiction of 4PET 1500 modifies the small contact region with the PR layer previously discussed. In 4PET 1500, the small contact region with PR layer 114 is second sense electrode 116. The second sense electrode's contact region with the PR layer is smaller than the contact region between the first sense electrode and the PR layer. Thus, the area of the contact region between second sense electrode 116 and PR layer 114 is less than the area of the contact region between first sense electrode 112 and PR layer 114. The differing sizes of the areas of the contact regions with the PR layer results in a pressure amplification on the PR layer when the PE layer expands. The alternative to this design is depicted by 4PET 1600 in FIG. 16, where first sense electrode 112 has a small contact region with PR layer 114. First sense electrode 112 is the electrode with the smaller contact region with PR layer 114 in 4PET 1600, as opposed to second sense electrode 116 in 4PET 1500. Other than which sense electrode has the smaller contact region with the PR layer, and thus where the force amplification on the PR layer occurs, the components of 4PET 1600 are similarly arranged as in 4PET 1500.

As depicted in FIGS. 11-16, when one or another contact point on the PR layer is small, the resistance in the PR will decrease only in the vicinity of the contact region, where the pressure is highest. This decrease in resistivity allows current to flow between the sense electrodes even in the presence of uncompressed PR layer elsewhere.

The advantage of designs with small contact regions on the PR layer is that the PE layer can have a small width and still exert a large pressure on the PR. The small PE width maximizes the areal density of piezoelectric devices on a chip. The small width of the PE also leads to a small PE capacitance and a small RC time, thereby speeding up operation.

For example, considering the pressure-voltage equation discussed above, where the area ratio A/a=9 or 25, and for the other variables (l/L=0.075, $Y_{PE}/Y_{PR}$=1.50, the voltage for a given pressure decreases by a factor of 0.75 to 0.87 if the PR area is 2 times smaller, and decreases by a factor of 0.63 to 0.80 if the PR area is 4 times smaller. The actual resistance can be tuned by appropriate choice of the PR material.

As an alternative or additional measure to prevent metal fatigue in the sense electrodes in FIGS. 11-16 above, the sense electrodes can be coated with a thin layer of a hard conducting film. An example of such coating is in Copper technology, where tantalum is used as a liner material to protect the Copper from metal fatigue.

The proposed embodiments have a means to amplify the pressure on the PR layer during expansion of the PE layer through the ratio of adjacent areas. Pressure amplification is important because PE layers can only exert a certain maximum pressure which may not be enough to significantly change the resistance in the PR layer.

The embodiments of the present invention propose three terminal PET designs that localize compression in the PR layer. The PE and PR layers have arbitrary widths that amplify the pressure on the PR layer by using a small contact region. The force from the PE layer is concentrated on a small region of the PR layer, allowing the PE and PR transverse dimensions to be equal for a minimum PET footprint. The designs all solve, in different ways, certain limitations that are inherent in the prior art design of FIG. 1.

Figure 17:
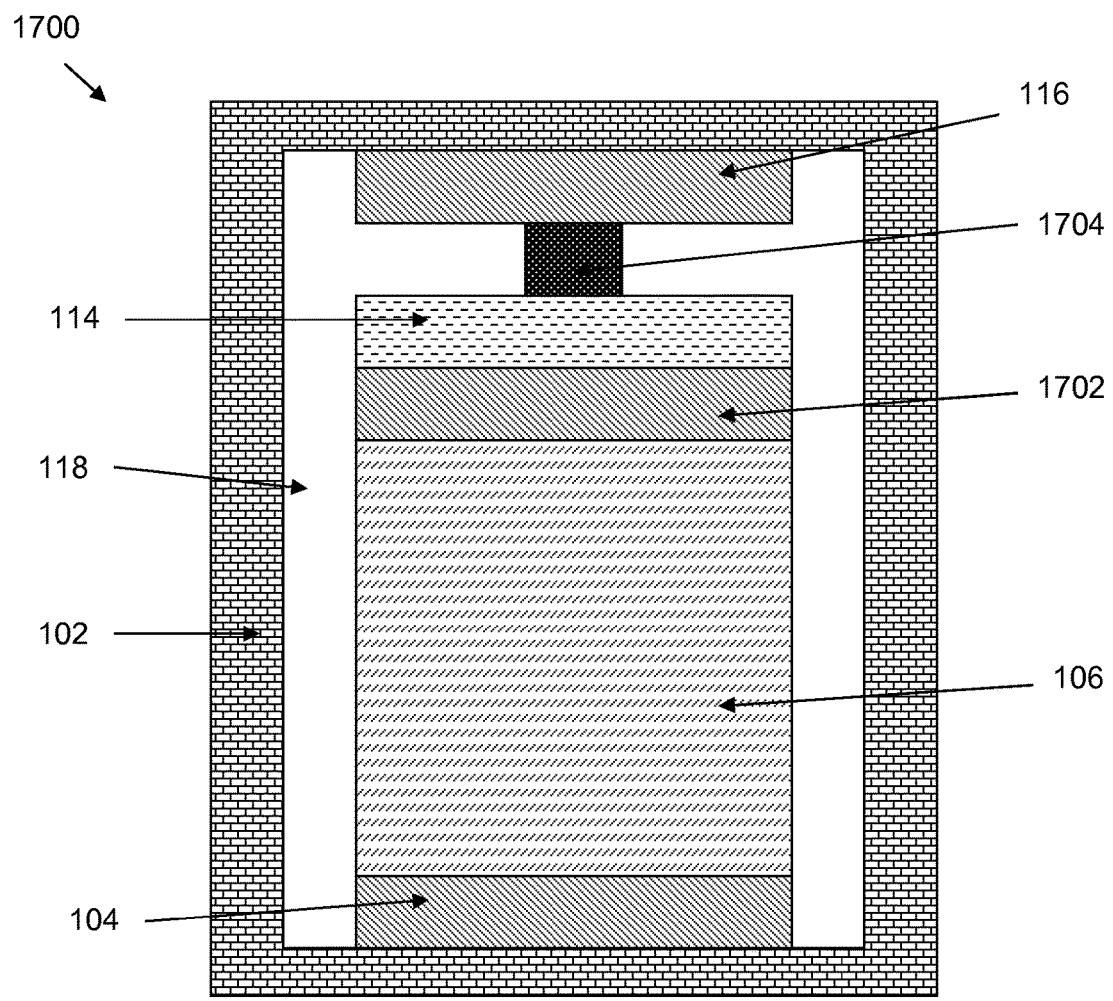
FIG. 17 is a schematic cross-sectional diagram of a three terminal piezoelectronic transistor (3PET) design, according to an embodiment of the present invention, where a conducting nanoparticle is located between a sense electrode and a piezoresistive (PR) layer.

Embodiments of the present invention involve three terminal PET designs. Therefore, the components of the proposed PETs differ slightly than discussed above in FIG. 1. Referring to FIG. 17, a cross-sectional diagram of a 3PET 1700 is shown. 3PET 1700 includes a PE layer 106 disposed on gate electrode 104. A common electrode 1702 is disposed on PE layer 106 and separates it from a PR layer 114. PR layer 114 is disposed on common electrode 1702. A conducting nanoparticle 1704 is disposed between PR layer 114 and a sense electrode 116. Conducting nanoparticle 1704 acts as a small contact between PR layer 114 and sense electrode 116. The nanoparticle's contact region with the PR layer is smaller than the contact region would be between the sense electrode and the PR layer, if the nanoparticle were not included in the design. Thus, the area of the contact region between conducting nanoparticle 1704 and PR layer 114 is less than the area of the contact region between common electrode 1702 and PR layer 114. The differing sizes of the areas of the contact regions with the PR layers results in pressure amplification on the PR layer when the PE layers expands. Surrounding and encapsulating all the components is a HYSM 102. There is a gap or vacant space 118 between the various layers of the PET and the sides of HYSM 102.

Figure 18:
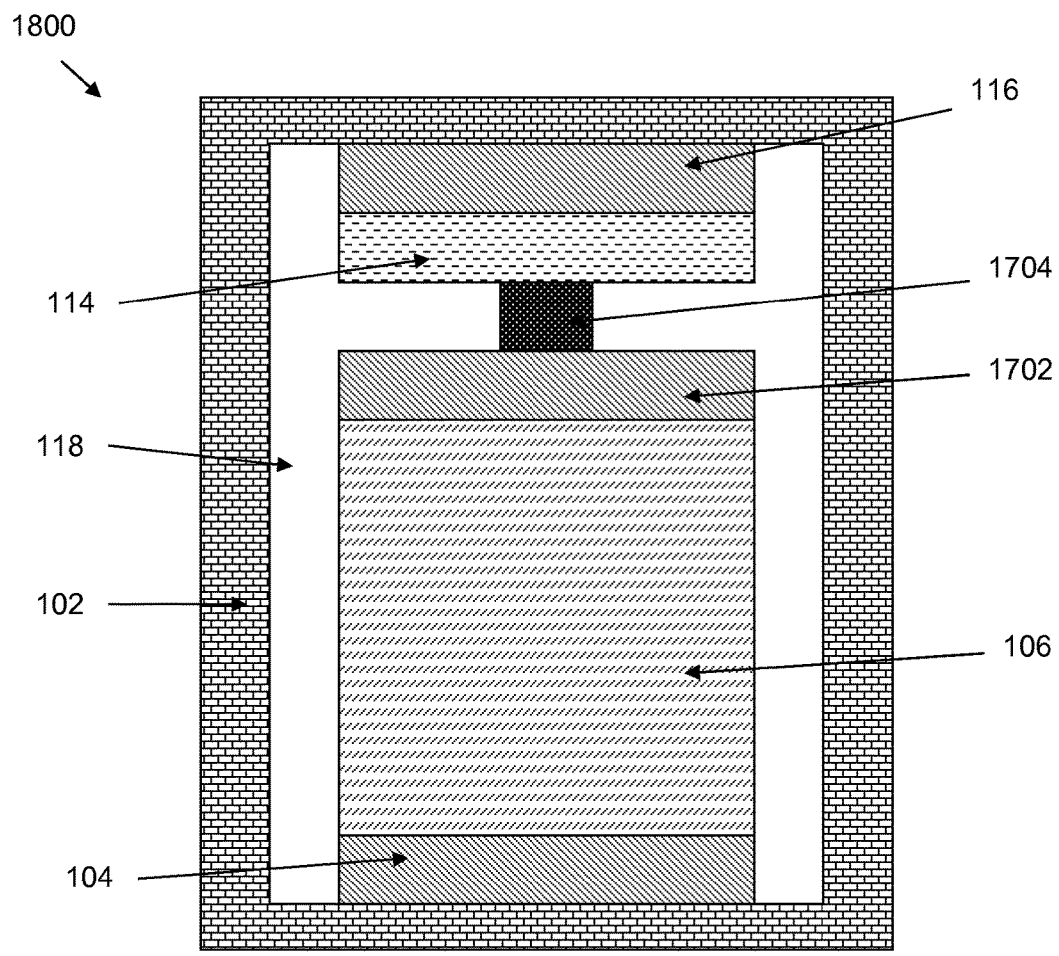
FIG. 18 is a schematic cross-sectional diagram of a 3PET design, according to an embodiment of the present invention, where a conducting nanoparticle is located between a common electrode and the PR layer.

FIG. 18 is a schematic cross-sectional diagram of a 3PET 1800, according to embodiments of the present invention. The design is an alternative embodiment of 3PET 1700. 3PET 1800 includes all the same components as 3PET 1700. The only variation is in relation to the location of conducting nanoparticle 1704. In 3PET 1800, conducting nanoparticle 1704 is disposed between common electrode 1702 and PR layer 114. Sense electrode 116 is disposed on PR layer 114. Conducting nanoparticle 1704 acts as a small contact between common electrode 1702 and PR layer 114. The nanoparticle's contact region with the PR layer is smaller than the contact region would be between the common electrode and the PR layer, if the nanoparticle were not included in the design. Thus, the area of the contact region between conducting nanoparticle 1704 and PR layer 114 is less than the area of the contact region between sense electrode 116 and PR layer 114. The nanoparticle that was between PR layer 114 and sense electrode 116 in 3PET 1700, is between common electrode 1702 and PR layer 114 in 3PET 1800. Other than the location of the nanoparticle, and thus where the force amplification on the PR layer occurs, the components from 3PET 1700 are similarly arranged in 3PET 1800.

Figure 19:
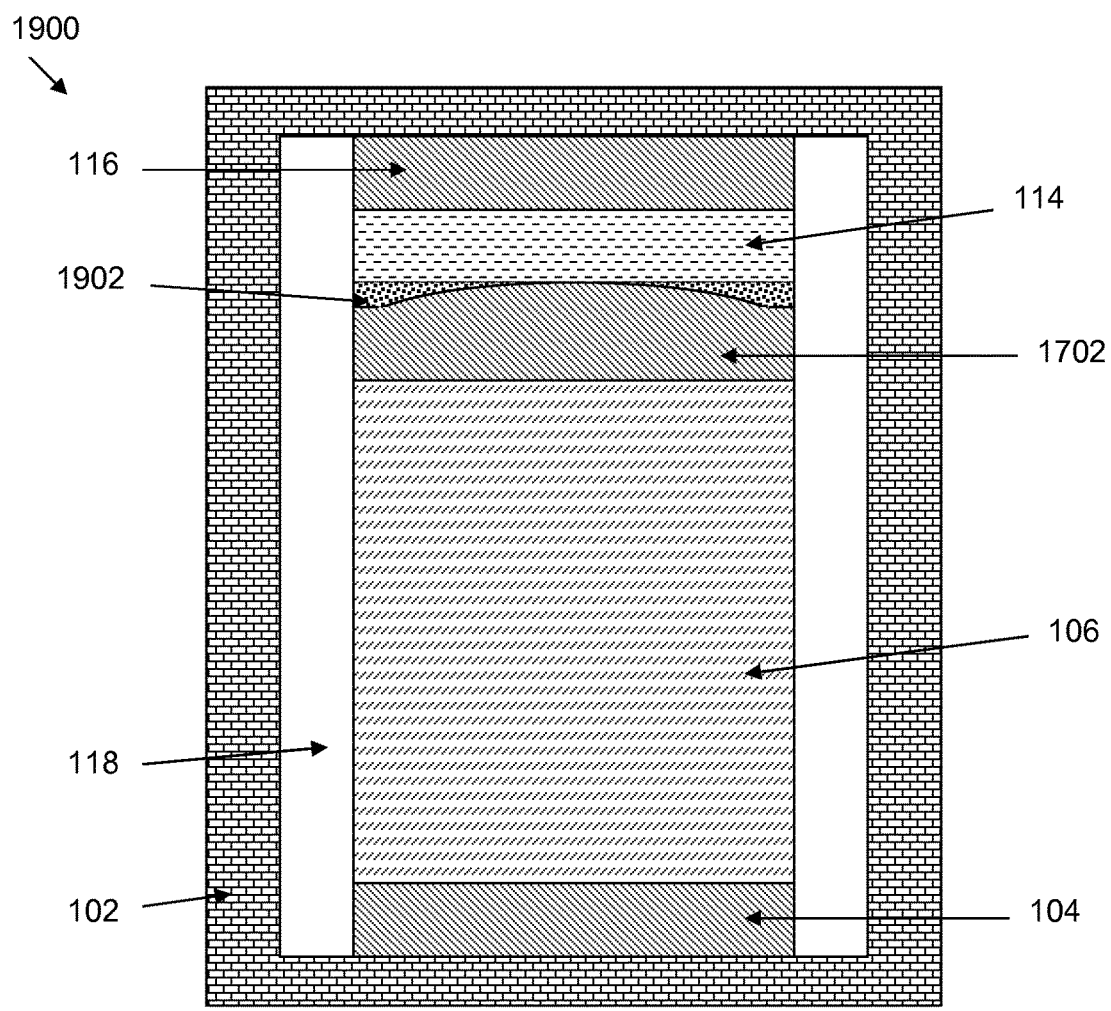
FIG. 19 is a schematic cross-sectional diagram of a 3PET design, according to an embodiment of the present invention, where a pointed tip of the common electrode is in contact with the PR layer.

According to another embodiment of the present invention, FIG. 19 depicts a schematic cross-sectional diagram of a 3PET 1900. The design involves an alternative small contact with the PR layer than the previous designs. 3PET 1900 includes a similar layout to the other PETs discussed. It includes a PE layer 106 disposed on gate electrode 104 and a common electrode 1702 disposed on PE layer 106. A PR layer 114 is disposed on common electrode 1702. A sense electrode 116 is disposed on PR layer 114. Common electrode 1702 has a pointed tip that serves as a small contact with PR layer 114. The pointed tip of common electrode 1702 is in contact with PR layer 114. A void space or soft material 1902 separates PR layer 114 from the remainder of common electrode 1702, so that only the pointed tip is in contact with PR layer 114. Thus, the area of the contact region between common electrode 1702 and PR layer 114 is less than the area of the contact region between PR layer 114 and sense electrode 116. The differing sizes of the areas of the contact regions with the PR layer results in a pressure amplification on the PR layer when the PE layers expands. The pointed tip can be made, for example, by side etching the electrode after it is deposited. As in the previous PET designs, a HYSM 102 surrounds and encapsulates the PET layers and a gap or vacant space 118 is between various layers and the sides of HYSM 102.

Figure 20:
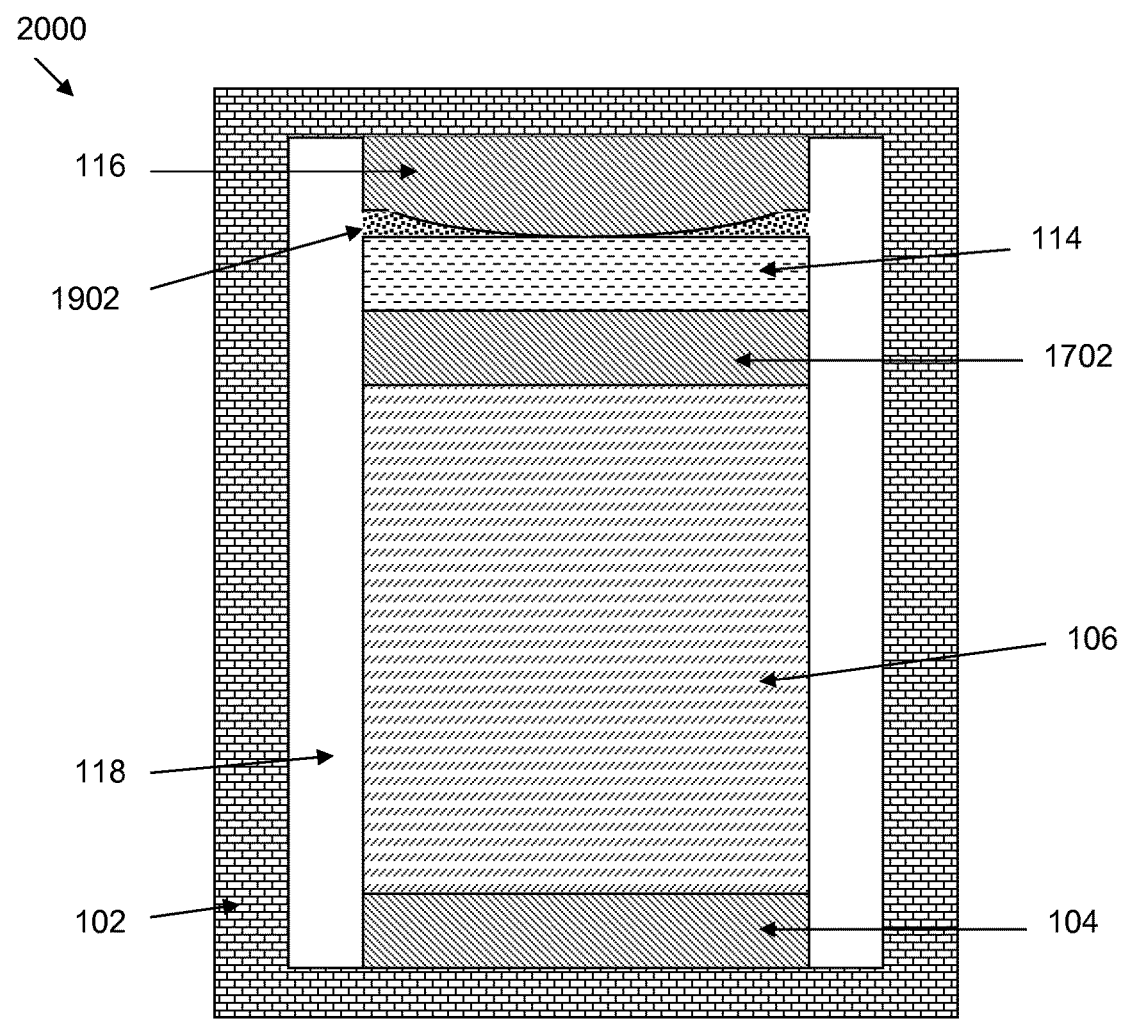
FIG. 20 is a schematic cross-sectional diagram of a 3PET design, according to an embodiment of the present invention, where a pointed tip of the sense electrode is in contact with the PR layer.

FIG. 20 shows an alternative embodiment to that in FIG. 19. FIG. 20 depicts a cross-sectional diagram of 3PET 2000. 3PET 2000 includes all the components from 3PET 1900. The only variation relates to the electrode that has a pointed tip that serves as a small contact with the PR layer. In 3PET 2000, sense electrode 116 has a pointed tip that serves as a small contact with PR layer 114. The pointed tip of sense electrode 116 is in contact with PR layer 114. There is a void space or soft material 1902 that separates PR layer 114 from the remainder of sense electrode 116, so that only the pointed tip is in contact with PR layer 114. Thus, the area of the contact region between sense electrode 116 and PR layer 114 is less than the areas of the contact region between PR layer 114 and common electrode 1702. Sense electrode 116 is the electrode with the pointed tip in contact with PR layer 114 in 3PET 2000, as opposed to the common electrode 1702 in 3PET 1900. Other than which electrode has the pointed tip in contact with the PR layer, and thus where the force amplification on the PR layers occurs, the components of 3PET 2000 are similarly arranged as in 3PET 1900.

Figure 21:
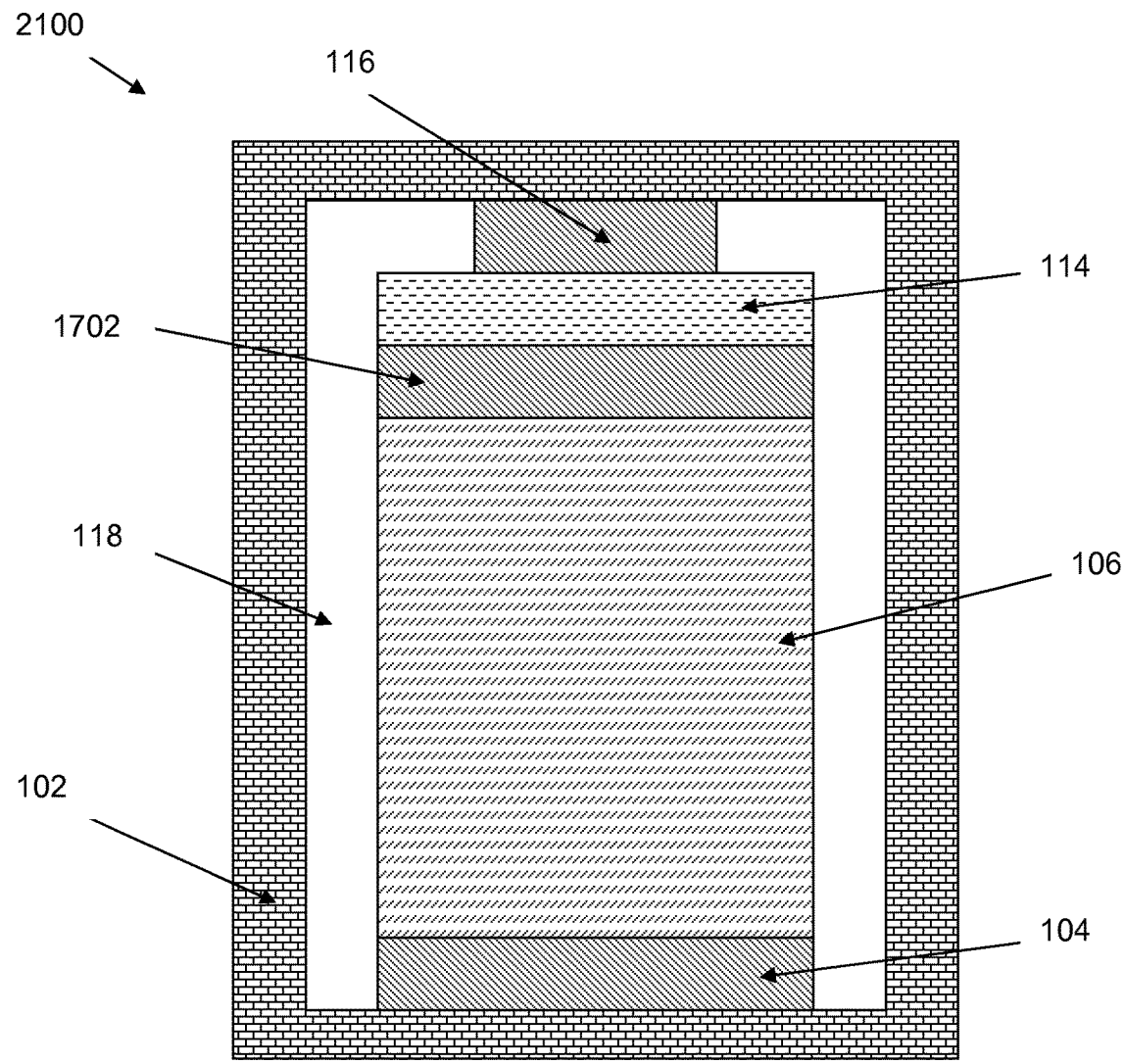
FIG. 21 is a schematic cross-sectional diagram of a 3PET design, according to an embodiment of the present invention, where the area of the contact region between the sense electrode and the PR layer is less than the area of the contact region between the common electrode and the PR layer.

FIG. 21 shows another embodiment where compression is localized in the PR layer. FIG. 21 depicts a cross-sectional diagram of 3PET 2100. Like the previous PETs, it includes a PE layer 106 disposed on gate electrode 104, a common electrode 1702 disposed on PE layer 106, a PR layer 114 disposed on common electrode 1702, and a sense electrode 116 disposed on PR layer 114. In 3PET 2100, sense electrode 116 has a small contact region with PR layer 114. The sense electrode's contact region with the PR layer is smaller than the contact region between the common electrode and the PR layer. Thus, the area of the contact region between sense electrode 116 and PR layer 114 is smaller than the area of the contact region between common electrode 1702 and PR layer 114. The differing sizes of the areas of the contact regions with the PR layers results in a pressure amplification on the PR layer when the PE layer expands. A HYSM 102 encapsulates the layers of the PET and between various layers and the sides of HYSM 102 there is a vacant space or gap 118.

Figure 22:
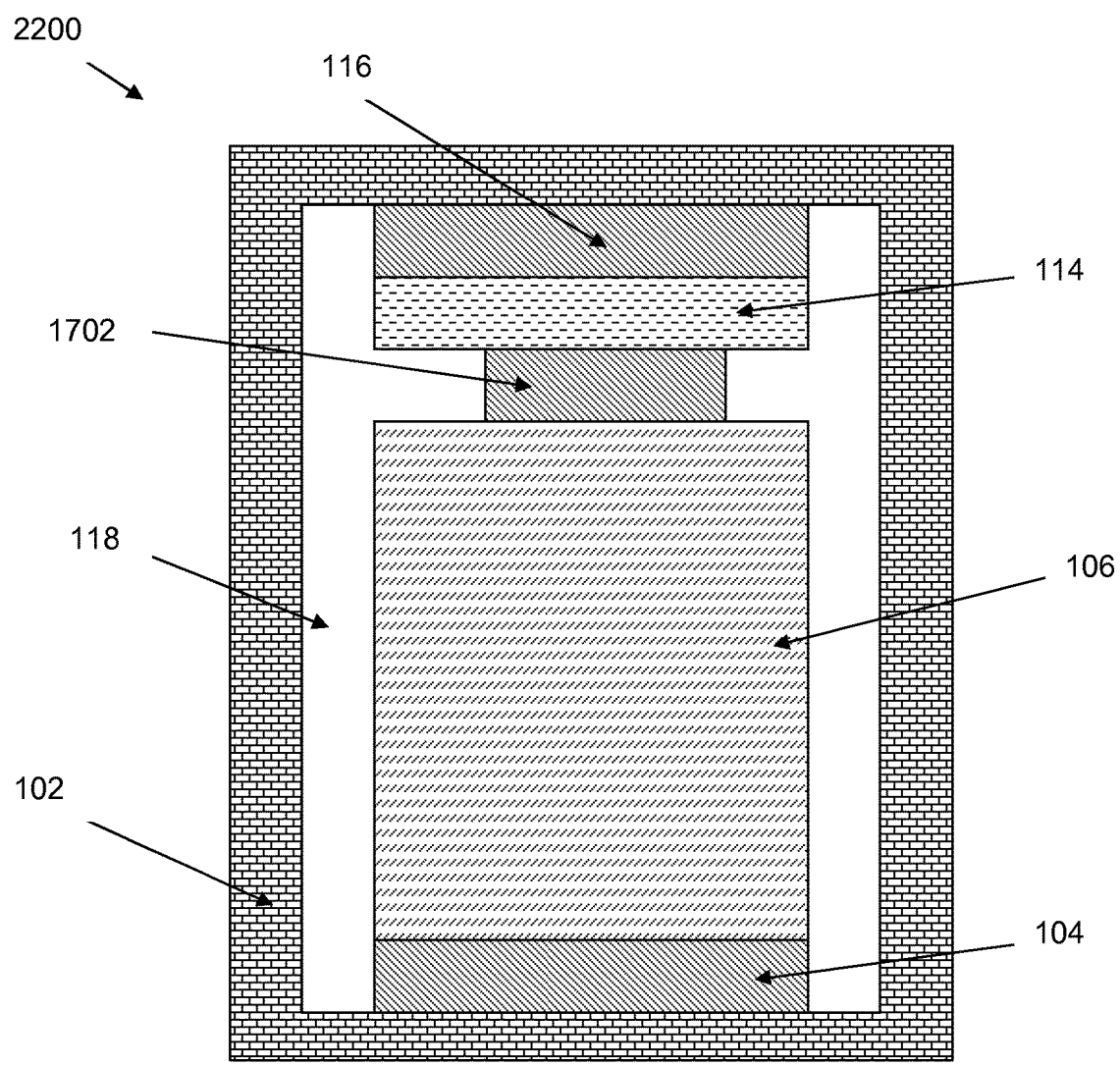
FIG. 22 is a schematic cross-sectional diagram of a 3PET design, according to an embodiment of the present invention, where the area of the contact region between the common electrode and the PR layer is less than the area of the contact region between the sense electrode and the PR layer.

An alternative embodiment to that in FIG. 21 is FIG. 22's diagram of 3PET 2200, where the small contact point with PR layer 114 is common electrode 1702. In FIG. 22, common electrode 1702 has a small contact region with PR layer 114. The common electrode's contact region with the PR layer is smaller than the contact region between the sense electrode and the PR layer. Thus, the area of the contact region between common electrode 1702 and PR layer 114 is less than the area of the contact region between sense electrode 116 and PR layer 114. Common electrode 1702 is the electrode with the smaller contact region with PR layer 114 in 3PET 2200, as opposed to sense electrode 116 in 3PET 2100. Other than which electrode has the smaller contact region with the PR layer, and thus where the force amplification on the PR layer occurs, the components of 3PET 2200 are similarly arranged as in 3PET 2100.

As depicted in FIGS. 17-22, when one contact point with the PR layer is small, the resistance in the PR will decrease only in the vicinity of the contact point, where the pressure is highest. This decrease in resistivity allows current to flow between the common and sense electrodes even in the presence of uncompressed PR layer elsewhere.

The advantage of designs with small contact points on the PR layer is that the PE layer can have a small width and still exert a large pressure on the PR. The small PE width maximizes the areal density of piezoelectric devices on a chip. The small width of the PE also leads to a small PE capacitance and a small RC time, thereby speeding up its operation.

For example, considering the pressure-voltage equation showing the relationship between pressure, P, voltage, V, and PR thickness, l:

$$P = d_{33}V/(l/Y_{PR} + d/Y_{PE})$$

where $d_{33}$ is the displacement per volt in the PE, $d = La/A$ is a reduced length equal to the PE thickness L multiplied by the ratio of PR area a to PE area A, and the Y are Young's moduli for the PR and PE. Where the area ratio $A/a = 9$ or 25, and for the other variables ($l/L = 0.075$, $Y_{PE}/Y_{PR} = 1.50$), the voltage for a given pressure decreases by a factor of 0.75 to 0.87 if the PR area is 2 times smaller, and decreases by a factor of 0.63 to 0.80 if the PR area is 4 times smaller. The actual resistance can be tuned by appropriate choice of the PR material.

As an alternative or additional measure to prevent metal fatigue in the sense electrode in FIGS. 17-22 above, the sense electrode can be coated with a thin layer of a hard conducting film. An example of such coating is in Copper technology, where tantalum is used as a liner material to protect the Copper from metal fatigue.

The proposed embodiments have a means to amplify the pressure on the PR during expansion of the PE through the ratio of adjacent areas. Pressure amplification is important because PE layers can only exert a certain maximum pressure which may not be enough to significantly change the resistance in the PR.

The embodiments of the present invention propose PET designs that localize compression in the PR layer. The PE and PR layers have arbitrary widths that amplify the pressure on the PR layer by using a small contact region. The force from the PE layer is concentrated on a small region of the PR layer, allowing the PE and PR transverse dimensions to be equal for a minimum PET footprint. The designs all solve, in different ways, certain limitations that are inherent in the prior art design of FIG. 1.

Figure 23:
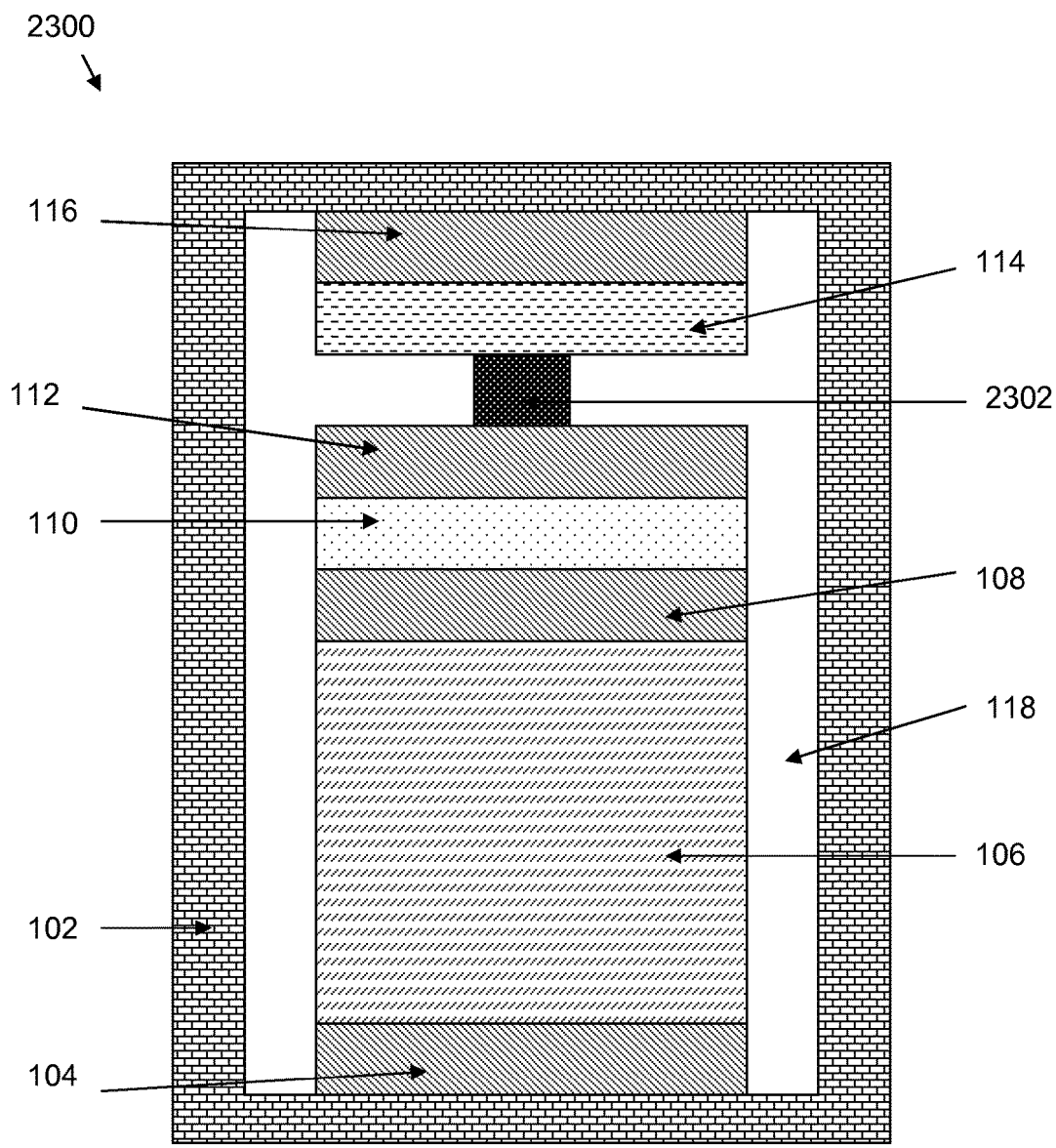
FIGS. 23 & 24 are schematic cross-sectional diagrams of 4PET designs, according to embodiments of the present invention, where a conducting nanoparticle is located between a sense electrode and a piezoresistive (PR) layer.

Referring to FIG. 23, a cross-sectional diagram of a 4PET 2300 is provided. 4PET 2300 includes a PE layer 106 disposed on a first gate electrode 104, and a second gate electrode 108 disposed on PE layer 106. An insulator layer 110 is disposed on second gate electrode 108 and separates second gate electrode 108 from a first sense electrode 112. A conducting nanoparticle 2302 is disposed between a PR layer 114 and first sense electrode 112. A second sense electrode 116 is disposed on PR layer 114. Conducting nanoparticle 2302 acts as a small contact between PR layer 114 and first sense electrode 112. The nanoparticle's contact region with the PR layer is smaller than the contact region would be between the first sense electrode and the PR layer, if the nanoparticle were not included in the design. Thus, the area of the contact region between conducting nanoparticle 2302 and PR layer 114 is less than the area of the contact region between second sense electrode 116 and PR layer 114. The differing sizes of the areas of the contact regions with the PR layer results in a pressure amplification on the PR layer when the PE layer expands. Surrounding and encapsulating all the components is a HYSM 102. There is a gap or vacant space 118 between various layers of the PET and the sides of HYSM 102.

Figure 24:
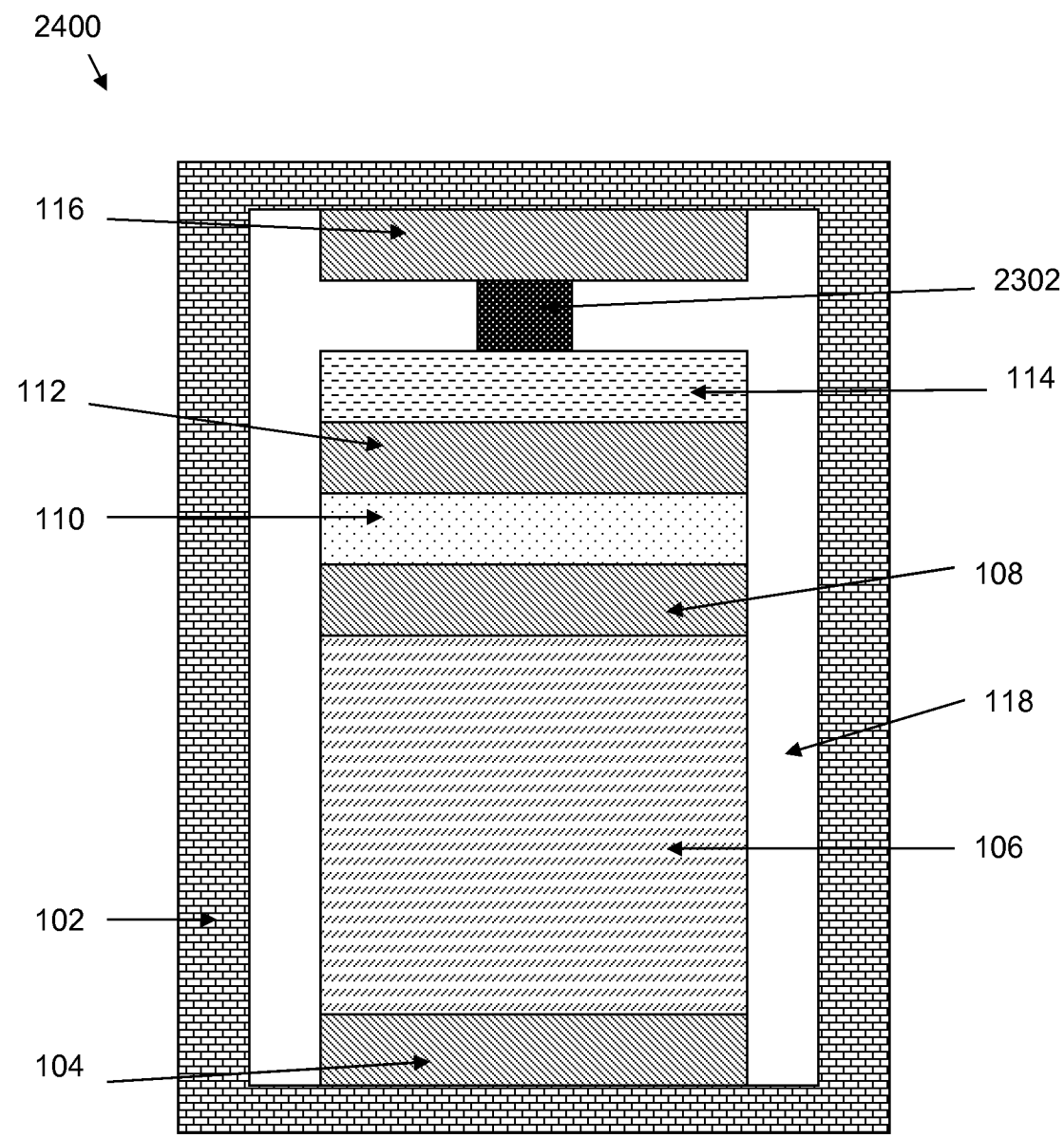

FIG. 24 is a schematic cross-sectional diagram of a 4PET 2400, according to embodiments of the present invention. The design is an alternative embodiment of 4PET 2300. 4PET 2400 includes all the same components as 4PET 2300. The only variation is in relation to the location of conducting nanoparticle 2302. In 4PET 2400, conducting nanoparticle 2302 is disposed between PR layer 114 and second sense electrode 116. Conducting nanoparticle 2302 acts as a small contact between PR layer 114 and second sense electrode 116. The nanoparticle's contact region with the PR layer is smaller than the contact region would be between the second sense electrode and the PR layer, if the nanoparticle were not included in the design. Thus, the area of the contact region between conducting nanoparticle 2302 and PR layer 114 is less than the area of the contact region between first sense electrode 112 and PR layer 114. The nanoparticle that was between PR layer 114 and first sense electrode 112 in 4PET 2300, is between second sense electrode 116 and PR layer 114 in 4PET 2400. Other than the location of the nanoparticle, and thus where the force amplification on the PR layer occurs, the components from 4PET 2300 are similarly arranged in 4PET 2400.

Figure 25:
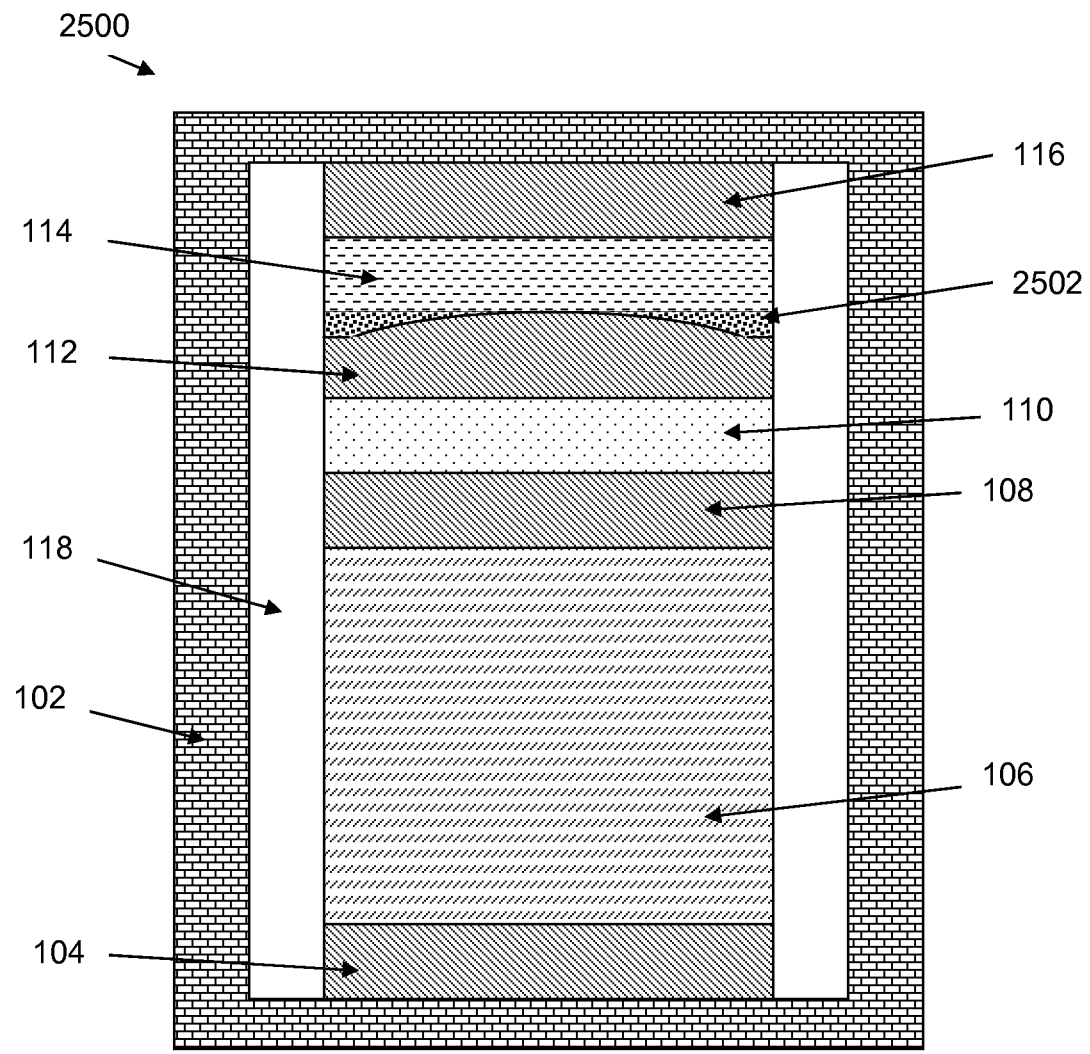
FIGS. 25 & 26 are schematic cross-sectional diagrams of 4PET designs, according to embodiments of the present invention, where a pointed tip of a sense electrode is in contact with the PR layer.

According to another embodiment of the present invention, FIG. 25 depicts a schematic cross-sectional diagram of a 4PET 2500. The design involves an alternative small contact with the PR layer than the previous designs. 4PET 2500 includes a similar layout to the other PETs discussed. It includes a PE layer 106 disposed on a first gate electrode 104, a second gate electrode 108 disposed on PE layer 106, and an insulator layer 110 disposed on second gate electrode 108. A first sense electrode 112 is disposed on insulator layer 110. A PR layer 114 is disposed between first sense electrode 112 and a second sense electrode 116. First sense electrode 112 has a pointed tip that serves as a small contact with PR layer 114. The pointed tip of first sense electrode 112 is in contact with PR layer 114. A void space or soft material 2502 separates PR layer 114 from the remainder of first sense electrode 112, so that only the pointed tip is in contact with PR layer 114. Thus, the area of the contact region between first sense electrode 112 and PR layer 114 is less than the area of the contact region between second sense electrode 116 and PR layer 114. The differing sizes of the areas of the contact regions with the PR layer results in a pressure amplification on the PR layer when the PE layer expands. The pointed tip can be made, for example, by side etching the electrode after it is deposited. As in the previous PET designs, a HYSM 102 surrounds and encapsulates the layers of the PET and a gap or vacant space 118 is between various layers and the sides of HYSM 102.

Figure 26:
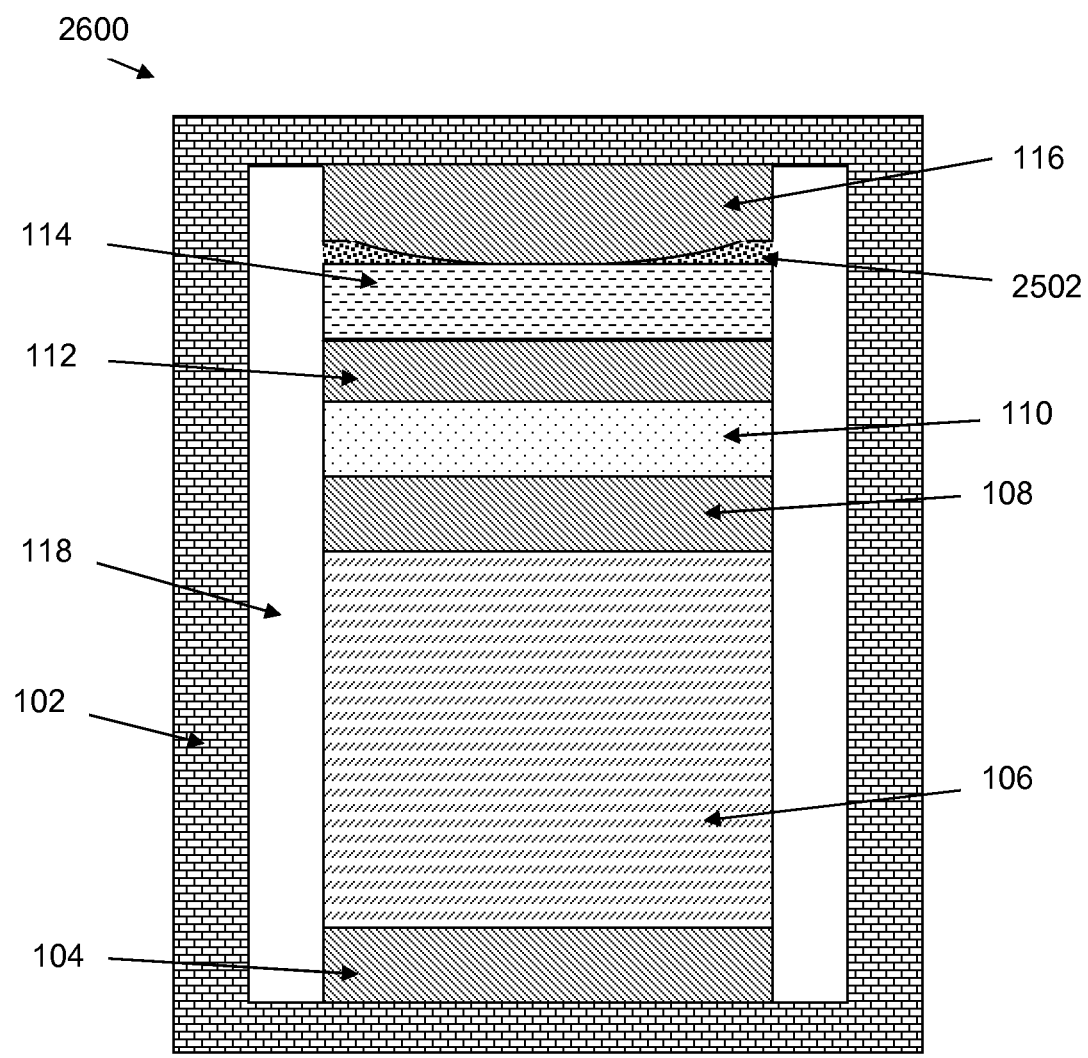

FIG. 26 shows an alternative embodiment to that in FIG. 25. FIG. 26 depicts a cross-sectional layout of 4PET 2600. 4PET 2600 contains all the components from 4PET 2500. The only variation relates to the electrode that has a pointed tip in contact with the PR layer. In 4PET 2600, second sense electrode 116 has a pointed tip that serves as a small contact with PR layer 114. The pointed tip of second sense electrode 116 is in contact with PR layer 114. There is a void space or soft material 2502 that separates PR layer 114 from the remainder of second sense electrode 116, so that only the pointed tip is in contact with PR layer 114. Thus, the area of the contact region between second sense electrode 116 and PR layer 114 is less than the area of the contact region between first sense electrode 112 and PR layer 114. Second sense electrode 116 is the electrode with the pointed tip in contact with PR layer 114 in 4PET 2600, as opposed to first sense electrode 112 in 4PET 2500. Other than which sense electrode has the pointed tip in contact with the PR layer, and thus where the force amplification on the PR layer occurs, the components of 4PET 2600 are similarly arranged as in 4PET 2500.

Figure 27:
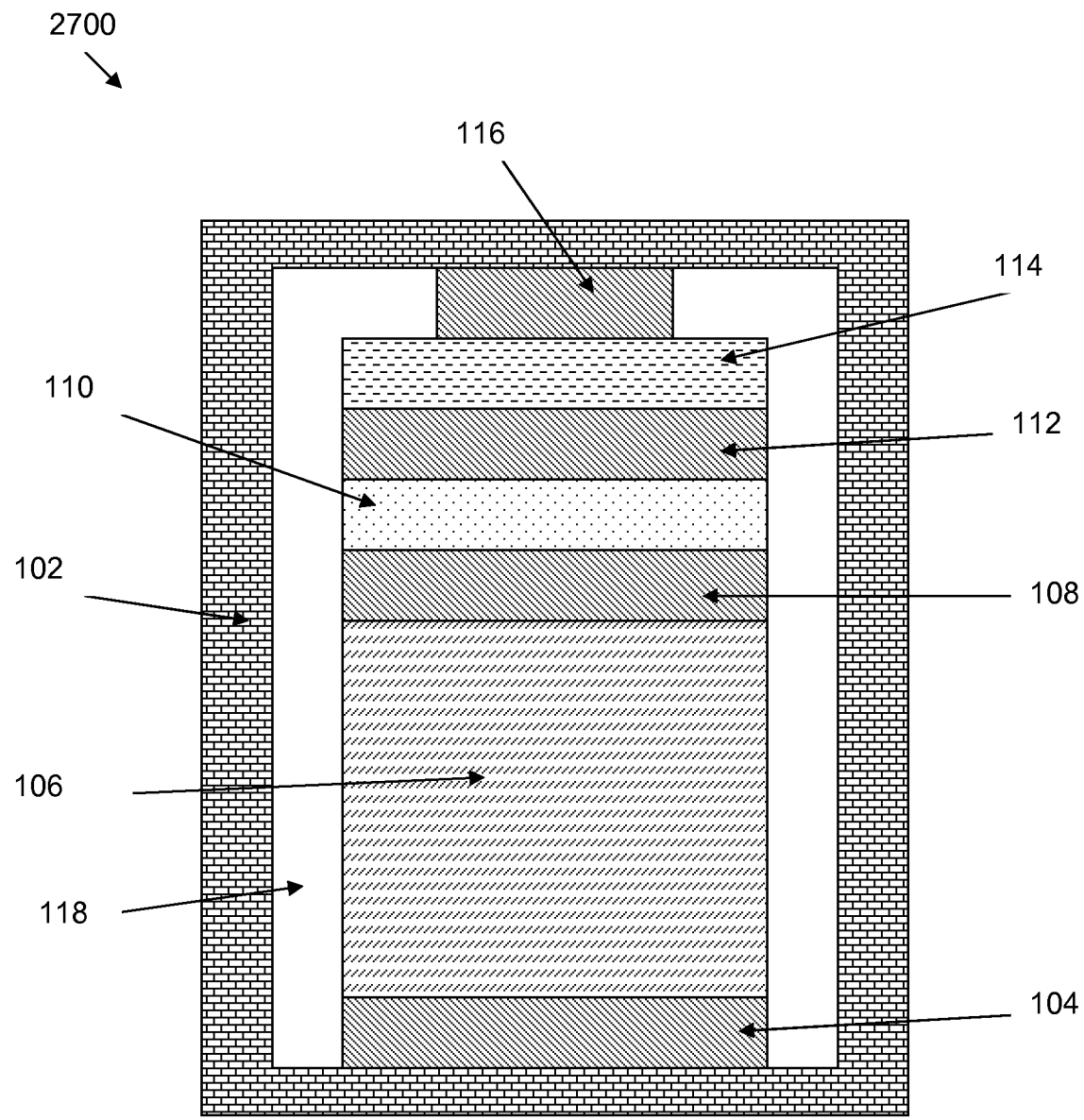
FIGS. 27 & 28 are schematic cross-sectional diagrams of 4PET designs, according to embodiments of the present invention, where the area of the contact region between one sense electrode and the PR layer is less than the area of the contact region between the other sense electrode and the PR layer.

FIG. 27 shows another embodiment where compression is localized in the PR layer. FIG. 27 depicts a cross-sectional diagram of 4PET 2700. Like the previous PETs, it includes a PE layer 106 disposed on a first gate electrode 104, a second gate electrode 108 disposed on PE layer 106, an insulator layer 110 disposed on second gate electrode 108, a first sense electrode 112 disposed on insulator layer 110, and a PR layer 114 disposed between first sense electrode 112 and a second sense electrode 116. In 4PET 2700, second sense electrode 116 has a small contact region with PR layer 114. The second sense electrode's contact region with the PR layer is smaller than the contact region between the first sense electrode and the PR layer. Thus, the area of the contact region between second sense electrode 116 and PR layer 114 is less than the area of the contact region between first sense electrode 112 and PR layer 114. The differing sizes of the areas of the contact regions with the PR layer results in a pressure amplification on the PR layer when the PE layer expands. A HYSM 102 encapsulates the layers of the PET and between various layers of the PET and the sides of HYSM 102 there is a vacant space or gap 118.

Figure 28:
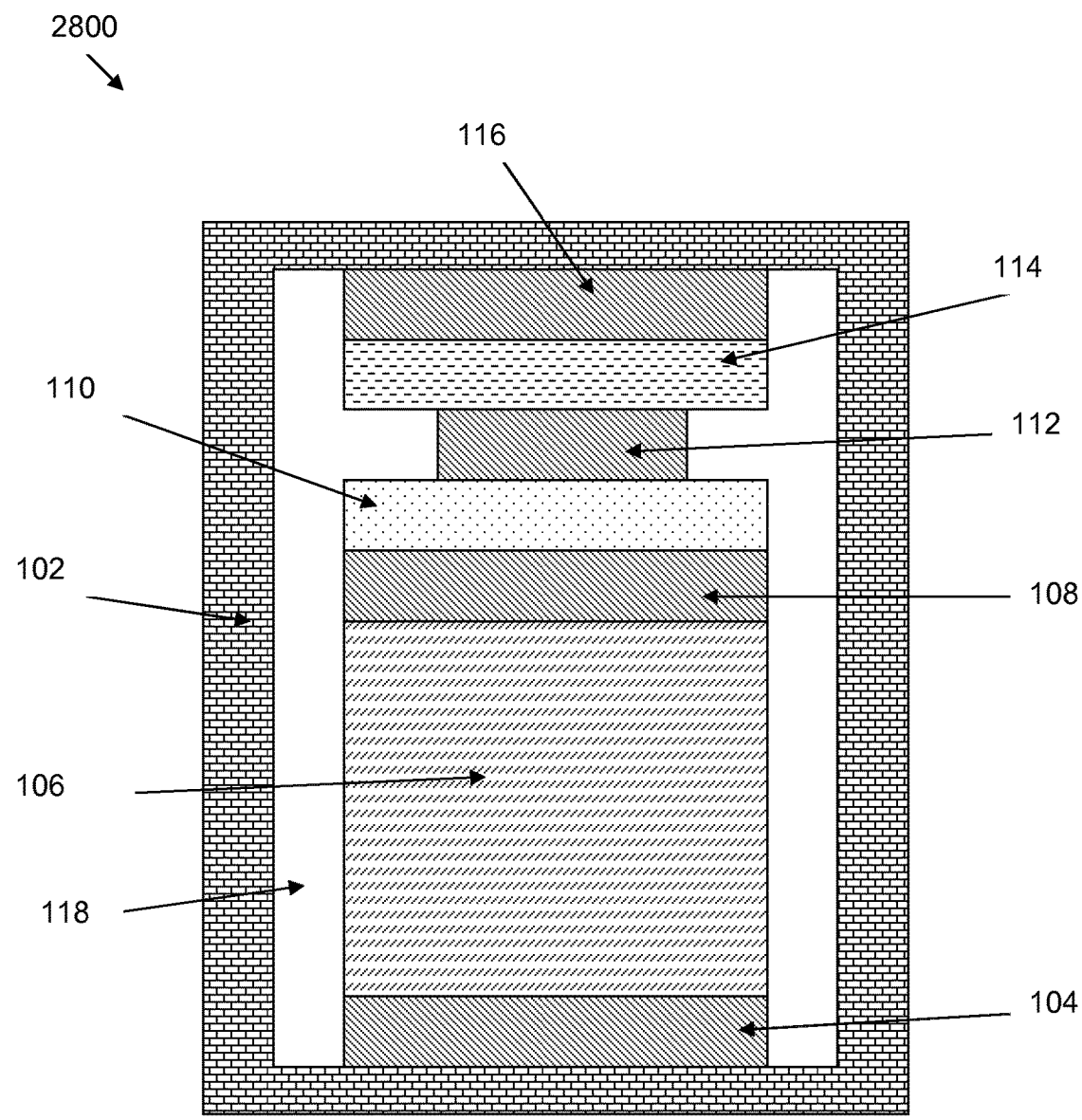

An alternative embodiment to that in FIG. 27 in FIG. 28's diagram of 4PET 2800, where the small contact region with PR layer 114 is first sense electrode 112. In FIG. 28, first sense electrode 112 has a small contact region with PR layer 114. The first sense electrode's contact region with the PR layer is smaller than the contact region between the second sense electrode and the PR layer. Thus, the area of the contact region between first sense electrode 112 and PR layer 114 is less than the area of the contact region between second sense electrode 116 and PR layer 114. First sense electrode 112 is the electrode with the smaller contact region with PR layer 114 in 4PET 2800, as opposed to second sense electrode 116 in 4PET 2700. Other than which sense electrode has the smaller contact region with the PR layer, and thus where the force amplification on the PR layer occurs, the components of 4PET 2800 are similarly arranged as in 4PET 2700.

As depicted in FIGS. 23-28, when one contact region on the PR layer is small, the resistance in the PR will decrease only in the vicinity of the contact region, where the pressure is highest. This decrease in resistivity allows current to flow between the sense electrodes even in the presence of uncompressed PR layer elsewhere.

The advantage of designs with small contact regions on the PR layer is that the PE layer can have a small width and still exert a large pressure on the PR. The small PE width maximizes the areal density of piezoelectric devices on a chip. The small width of the PE also leads to a small PE capacitance and a small RC time, thereby speeding up operation.

For example, considering the pressure-voltage equation showing the relationship between pressure, P, voltage, V, and PR thickness, l:

$$P = d_{33} V / (l/Y_{PR} + d/Y_{PE})$$

where $d_{33}$ is the displacement per volt in the PE, $d = La/A$ is a reduced length equal to the PE thickness L multiplied by the ratio of PR area a to PE area A, and the Y are Young's moduli for the PR and PE. Where the area ratio A/a=9 or 25, and for the other variables (l/L=0.075, $Y_{PE}/Y_{PR}$=1.50), the voltage for a given pressure decreases by a factor of 0.75 to 0.87 if the PR area is 2 times smaller, and decreases by a factor of 0.63 to 0.80 if the PR area is 4 times smaller. The actual resistance can be tuned by appropriate choice of the PR material.

As an alternative or additional measure to prevent metal fatigue in the sense electrodes in FIGS. 23-28 above, the sense electrodes can be coated with a thin layer of a hard conducting film. An example of such coating is in Copper technology, where tantalum is used as a liner material to protect the Copper from metal fatigue.

The proposed embodiments have a means to amplify the pressure on the PR layer during expansion of the PE layer through the ratio of adjacent areas. Pressure amplification is important because PE layers can only exert a certain maximum pressure which may not be enough to significantly change the resistance in the PR layer.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A piezoelectric device, comprising:
a first electrode;
a piezoelectric layer disposed on the first electrode;
a second electrode disposed on the piezoelectric layer;
an insulator layer disposed on the second electrode;
a piezoresistive layer, having a top, a bottom, a left, and a right side, disposed on the insulator layer;
a third electrode, having a first portion and a second portion, disposed on the insulator layer;
a fourth electrode, having a first portion and a second portion, disposed on the insulator layer;
a semi-rigid housing, having a top, a bottom, and two sides;
wherein the semi-rigid housing surrounds the piezoelectric layer, the piezoresistive layer, the insulator layer, and the electrodes;
wherein the bottom of the semi-rigid housing is in contact with the first electrode and the top of the semi-rigid housing is in contact with the third and fourth electrodes and the piezoresistive layer;
wherein the first and second portion of the third electrode, the first and second portion of the fourth electrode, and the piezoresistive layer each have a yield strength;
wherein between the two sides of the semi-rigid housing and the layers and the electrodes is a void; and
wherein an applied voltage across the first and second electrodes causes a pressure from the piezoelectric layer to be applied to the piezoresistive layer through the insulator layer, such that an electrical resistance of the piezoresistive layer is dependent upon the pressure applied by the piezoelectric layer.

2. The device of claim 1, wherein the third and fourth electrodes are coated with a layer of conducting film.

3. The device of claim 1, wherein:
the first portion of the third electrode wraps the left side of the piezoresistive layer; and
the first portion of the fourth electrode wraps the right side of the piezoresistive layer.

4. The device of claim 3, wherein:
the second portion of the third electrode is disposed on the top side of the piezoresistive layer; and
the second portion of the fourth electrode is disposed on the top side of the piezoresistive layer.

5. The device of claim 4, wherein the semi-rigid housing is in contact with the second portions of the third and fourth electrodes.

6. The device of claim 5, wherein a distance in the transverse direction separates the second portions of the third and fourth electrodes on the top side of the piezoresistive layer from each other.

7. The device of claim 6, wherein the semi-rigid housing is in contact with the top side of the piezoresistive layer at the distance between the second portions of the electrodes.

8. The device of claim 5, wherein between the semi-rigid housing and the first portions of the third and fourth electrodes is a void.

9. The device of claim 5, wherein between the second and third electrodes is a connection forming a common electrode.

10. The device of claim 5, wherein between the second and fourth electrodes is a connection forming a common electrode.

11. The device of claim 5, wherein the first portions of the third and fourth electrodes have smaller yield strengths than the second portions of the third and fourth electrodes and the piezoresistive layer.

12. The device of claim 11, wherein the second portions of the third and fourth electrodes are embedded in the semi-rigid housing.

13. The device of claim 3, wherein:
the second portion of the third electrode wraps the bottom side of the piezoresistive layer; and
the second portion of the fourth electrode wraps the bottom side of the piezoresistive layer.

14. The device of claim 13, wherein the second portions of the third and fourth electrodes are embedded in the insulator layer.

15. The device of claim 13, wherein a distance in the transverse direction separates the second portions of the third and fourth electrodes on the bottom side of the piezoresistive layer from each other.

16. The device of claim 15, wherein the insulator layer is in contact with the bottom side of the piezoresistive layer at the distance between the second portions of the third and fourth electrodes.

17. The device of claim 13, wherein the first portions of the third and fourth electrodes have smaller yield strengths than the second portions of the third and fourth electrodes and the piezoresistive layer.

18. A piezoelectric device, comprising:
a first spacing layer;
a second spacing layer;
a first electrode disposed on the first spacing layer;
a second electrode disposed on the second spacing layer;
a piezoelectric layer, grown with 100 orientation, partially disposed on the first spacing layer and partially disposed on the second spacing layer, wherein the piezoelectric layer is disposed between the first electrode and the second electrode;
an insulator layer disposed on the piezoelectric layer;
a third electrode, having a first portion and a second portion, disposed on the insulator layer;
a piezoresistive layer, having a top, a bottom, a left, and a right side, disposed on the insulator layer;
a fourth electrode, having a first portion and a second portion, disposed on the insulator layer;
a semi-rigid housing, having a top, a bottom and two sides;
wherein the semi-rigid housing surrounds the piezoelectric layer, the piezoresistive layer, the insulator layer, the spacing layers, and the electrodes;
wherein the bottom of the semi-rigid housing is in contact with the first and second spacing layers, partial contact with the piezoelectric layer;
wherein the top of the semi-rigid housing is in contact with the third and fourth electrodes and the piezoresistive layer;
wherein between the two sides of the semi-rigid housing and the layers and the electrodes is a void;
wherein the first and second portion of the third electrode, the first and second portion of the fourth electrode, and the piezoresistive layer each have a yield strength; and wherein an applied voltage across the first and second electrodes causes an expansion of the piezoelectric layer in the transverse direction whereby a pressure from the piezoelectric layer is applied to the piezoresistive layer through the insulator layer, such that an electrical resistance of the piezoresistive layer is dependent upon the pressure applied by the piezoelectric layer.

19. The device of claim 18, wherein the third and fourth electrodes are coated with a layer of conducting film.

20. The device of claim 18, wherein:
the first portion of the third electrode wraps the left side the piezoresistive layer;
the second portion of the third electrode is disposed on the top side of the piezoresistive layer;
the first portion of the fourth electrode wraps the right side of the piezoresistive layer;
the second portion of the fourth electrode is disposed on the top side of the piezoresistive layer; and
the top of the semi-rigid housing is in contact with the second portions of the third and fourth electrodes.

21. The device of claim 20, wherein:
a distance in the transverse direction separates the second portions of the third and fourth electrodes on the top side of the piezoresistive layer from each other; and
the semi-rigid housing is in contact with the top side of the piezoresistive layer at the distance between the second portions of the electrodes.

22. The device of claim 20, wherein between the semi-rigid housing and the first portions of the third and fourth electrode is a void.

23. The device of claim 20, wherein:
the first portions of the third and fourth electrodes have smaller yield strengths than the second portions of the third and fourth electrodes, and the piezoresistive layer; and
the second portions of the third and fourth electrodes are embedded in the semi-rigid housing.

24. The device of claim 18, wherein:
the first portion of the third electrode wraps the left side of the piezoresistive layer;
the second portion of the third electrode wraps the bottom side of the piezoresistive layer;
the first portion of the fourth electrode wraps the right side of the piezoresistive layer; and
the second portion of the fourth electrode wraps the bottom side of the piezoresistive layer.

25. The device of claim 24, wherein the second portions of the third and fourth electrodes are embedded in the insulator layer.

26. The device of claim 24, wherein:
a distance in the transverse direction separates the second portions of the third and fourth electrodes on the bottom side of the piezoresistive layer from each other; and
the insulator layer is in contact with the bottom of the piezoresistive layer at the distance between the second portions of the third and fourth electrodes.

27. The device of claim 24, wherein the first portions of the third and fourth electrodes have smaller yield strengths than the second portions of the third and fourth electrodes and the piezoresistive layer.

* * * * *